(12) United States Patent
Kim et al.

(10) Patent No.: US 7,056,777 B2
(45) Date of Patent: Jun. 6, 2006

(54) THIN FILM TRANSISTOR ARRAY SUBSTRATE, MANUFACTURING METHOD THEREOF, AND MASK

(75) Inventors: Woong Kwon Kim, Kyounggi-do (KR); Heung Lyul Cho, Kyounggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/385,501

(22) Filed: Mar. 12, 2003

(65) Prior Publication Data

US 2003/0197182 A1 Oct. 23, 2003

(30) Foreign Application Priority Data

Apr. 17, 2002 (KR) ............... 10-2002-0021053

(51) Int. Cl.
*G02F 1/136* (2006.01)
(52) U.S. Cl. ............... 438/158; 438/30; 349/42; 349/43
(58) Field of Classification Search ............... 257/59, 257/72, E21.411, E21.414; 438/30, 158; 349/42, 43, 46
See application file for complete search history.

(56) References Cited

U.S. PATENT DOCUMENTS

| 6,038,003 A * | 3/2000 | Kim ............... 349/43 |
| 6,338,989 B1 * | 1/2002 | Ahn et al. ............... 438/158 |
| 6,759,283 B1 * | 7/2004 | Yasuda et al. ............... 438/149 |

FOREIGN PATENT DOCUMENTS

| KR | 2001-20873 | 3/2001 |
| KR | 2001-0020873 | 3/2001 |
| KR | 2001-92358 | 10/2001 |
| KR | 2001-104667 | 11/2001 |
| KR | 2000-112815 | 12/2001 |
| KR | 2001-109681 | 12/2001 |
| KR | 2001-0112815 | 12/2001 |
| KR | 2001-112815 | 12/2001 |
| KR | 2003-0082144 | 10/2003 |

* cited by examiner

*Primary Examiner*—Kenneth Parker
*Assistant Examiner*—Matthew Landau
(74) *Attorney, Agent, or Firm*—Morgan, Lewis & Bockius, LLP

(57) ABSTRACT

A thin film transistor array substrate including a gate pattern having a gate electrode, a gate line connected to the gate electrode, and a gate pad connected to the gate line, a source/drain pattern having a source electrode, a drain electrode, a data line connected to the source electrode, and a data pad connected to the data line, a gate insulating pattern formed along a matrix pattern including the gate pattern and the source/drain pattern except for a pixel area, a semiconductor pattern formed on the gate insulating pattern having a same pattern as the gate insulating pattern and partially removed at a thin film transistor area and the gate line area, and a transparent electrode pattern having a pixel electrode formed at the pixel area and connected to the drain electrode, a gate pad protective electrode formed on the gate pad, and a data pad protective electrode formed on the data pad.

10 Claims, 28 Drawing Sheets

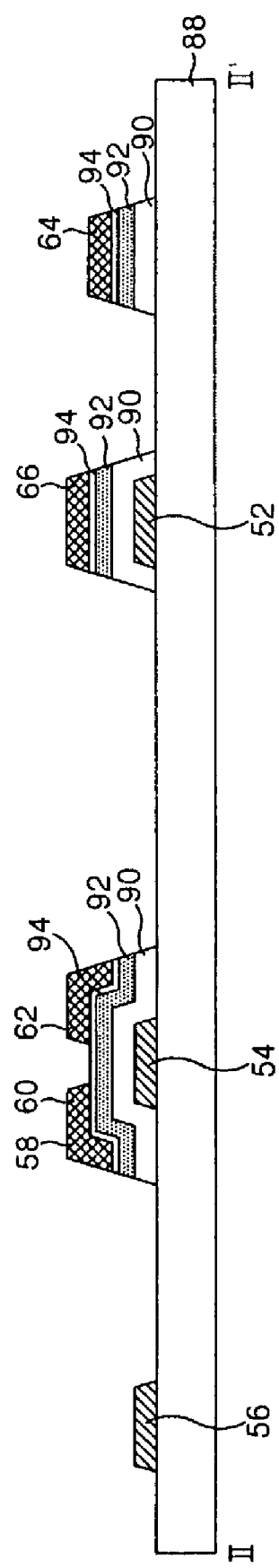

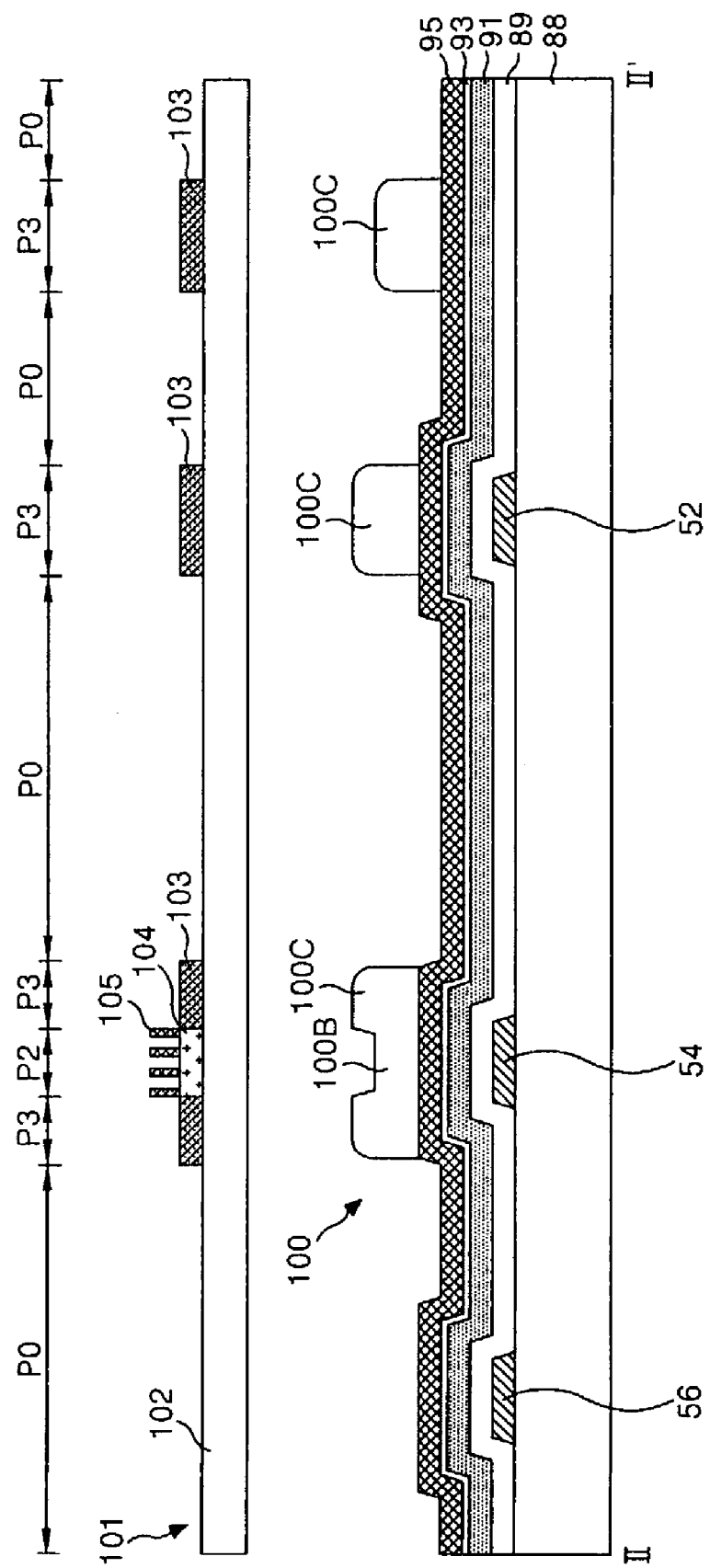

THIN FILM TRANSISTOR ARRAY SUBSTRATE, MANUFACTURING METHOD THEREOF, AND MASK

The present invention claims the benefit of Korean Patent Application No. P2002-21053 filed in Korea on Apr. 17, 2002, which is hereby incorporated by reference.

BACKGROUND OF THE INVENTION

1. Field of the Invention

The present invention relates to a thin film transistor array substrate, and more particularly, to a thin film transistor array substrate in a liquid crystal display device and its manufacturing method and mask used in the manufacturing method.

2. Description of the Related Art

In general, liquid crystal display (LCD) devices control light transmittance using application of an electric field to produce an image. The LCD devices commonly include a liquid crystal panel having liquid crystal cells arranged in a matrix, and a driving circuit for driving the liquid crystal cells.

The liquid crystal display panel includes a thin film transistor array substrate and an opposing color filter array substrate, wherein spacers are positioned between two substrates to maintain a constant cell gap and a liquid crystal material is provided within the cell gap. The thin film transistor array substrate commonly includes gate lines and data lines, thin film transistor switching devices at intersections of the gate lines and the data lines, pixel electrodes within liquid crystal cells defined by the crossing gate and data lines and connected to the thin film transistors, and alignment films. The gate lines and the data lines transmit signals from driving circuits via gate and data pad portions, respectively. The thin film transistors convey pixel voltages transmitted on the data lines to the pixel electrodes in response to scanning signals transmitted by the gate lines. The color filter array substrate commonly includes color filters for each of the liquid crystal cells, a black matrix that divides the color filters, a common electrode for supplying a reference voltage to the liquid crystal cells, and an alignment film.

The liquid crystal display panel is generally made by preparing the thin film array substrate and the color filter array substrate individually, joining the thin film array substrate and the color filter array substrate together, injecting a liquid crystal material between the substrates, and sealing the liquid crystal material between thin film array substrate and the color filter array substrate. Since fabricating a thin film transistor array substrate requires multiple masking processes, manufacturing a thin film transistor array substrate is significant in the production costs of a liquid crystal display panel. Accordingly, since each mask process includes many sub-processes, such as deposition, cleaning, photolithography, etching, photo-resist stripping, and inspection. Accordingly, in order to reduce production costs, significant efforts have been made to reduce the total number of required masking processes.

FIG. 1 is a partial plan view of a thin film transistor array substrate according to the related art, and FIG. 2 is a cross sectional view of the thin film transistor array substrate of FIG. 1 along I–I' according to the related art. In FIG. 1, a thin film transistor array substrate includes crossing gate lines 2 and data lines 4 on a lower substrate 42 (in FIG. 2), wherein a gate insulating film 44 (in FIG. 2) separates the gate and data lines 2 and 4. A thin film transistor 6 is provided at each intersection, and pixel electrodes 18 are provided within liquid crystal cells defined by the gate and data lines 2 and 4. The thin film transistor array substrate includes storage capacitors 20 formed by an overlap of pixel electrodes 18 and gate lines 2. In addition, gate pad portions 26 connect to the gate lines 2, and data pad portions 34 connect to the data lines 4.

Each thin film transistor 6 includes a gate electrode 8 that is connected to a gate line 2, a source electrode 10 that is connected to a data line 4, a drain electrode 12 that is connected to a pixel electrode 18, and an active layer 14 that overlaps the gate electrode 8 to define a channel between the source electrode 10 and the drain electrode 12. The thin film transistor 6 allows a pixel voltage signal transmitted along the data line 4 to be supplied to the pixel electrode 18 and to a storage capacitor 20 in response to a gate signal transmitted along the gate line 2. In addition, the active layer 14 overlaps the data pad 36, the storage electrode 22, and the data line 4, and an ohmic contact layer 48 is provided on the active layer 14 for making ohmic contact (in FIG. 2).

In FIGS. 1 and 2, the pixel electrode 18 is connected, via a first contact hole 16 through a protective film 50, to the drain electrode 12. The pixel electrode 18 is used for producing a potential difference with respect to a common electrode (not shown) formed on the upper substrate (not shown) when charged with a pixel voltage. This potential difference rotates liquid crystals (not shown) disposed between the thin film transistor array substrate and the upper substrate (not shown) due to a dielectric anisotropy of the liquid crystals. Thus, the pixel voltage controls an amount of light transmitted through the upper substrate from a light source input positioned beneath the lower substrate 42 through the pixel electrode 18.

The storage capacitor 20 includes a portion of a "pre-stage" gate line 2. The storage capacitor 20 also includes a storage electrode 22 that overlaps the gate line 2, an interposed gate insulating film 44, an interposed active layer 14, and an interposed ohmic contact layer 48. A portion of the pixel electrode 18 disposed on the protective film 50 contacts the storage electrode 22 through a second contact hole 24 in the protective film 50. Accordingly, the storage capacitor 20 stably maintains the pixel voltage on the pixel electrode 18 until the next pixel voltage is applied.

The gate line 2 is connected, via the gate pad portion 26, to a gate driver (not shown). The gate pad portion 26 includes a gate pad 28, which extends from the gate line 2, and a gate pad protection electrode 32 that is connected, via a third contact hole 30 through the gate insulating film 44 and through the protective film 50, to the gate pad 28. The data line 4 is connected, via the data pad portion 34, to a data driver (not shown). The data pad portion 34 includes a data pad 36 that extends from the data line 4, and a data pad protection electrode 40 that is connected, via a fourth contact hole 38 through the protective film 50, to the data pad 36.

FIGS. 3A to 3D are cross sectional views illustrating a method of manufacturing the thin film transistor array substrate shown in FIG. 2 according to the related art. In FIG. 3A, a gate metal layer is formed on the upper substrate 42 by deposition, and the gate metal layer is patterned by photolithography and etching using a first mask process to form the gate line 2, the gate electrode 8, and the gate pad 28. The gate metal layer includes a single-layer or double-layer structure of chrome (Cr), molybdenum (Mo), or aluminum.

In FIG. 3B, a gate insulating film, an undoped amorphous silicon layer, an n⁺ amorphous silicon layer, and source/drain metal layer are sequentially provided by deposition, and a photo-resist pattern is formed on the source/drain metal layer by photolithography using a second mask, thereby forming a gate insulating film 44, an active layer 14, an ohmic contact layer 48, and source/drain patterns. In this case, a diffractive exposure mask having a diffractive exposing part at the channel region of the thin film transistor is used as a second mask. Accordingly, the photo-resist pattern at channel regions has a lower height than the remainder of the photo-resist. Subsequently, the source/drain metal layer is patterned using a wet etching process to provide source/drain patterns that include the data line 4, the source electrode 10, the drain electrode 12, which is presently integral with the source electrode 10, and the storage electrode 22.

Next, the $n^+$ amorphous silicon layer and the amorphous silicon layer are patterned using a dry etching process and uses the same photo-resist pattern to provide the ohmic contact layer 48 and the active layer 14. The relatively low height photo-resist pattern is removed from the channel portion by an ashing process. Thereafter, the source/drain pattern and the ohmic contact layer 48 at the channel portion are etched by a wet etching process. Thus, part of the active layer 14 is exposed to disconnect the source electrode 10 from the drain electrode 12. Then, the remaining photo-resist pattern is removed by a stripping process. The gate insulating film 14 is made from an inorganic insulating material, such as silicon nitride ($SiN_x$) or silicon oxide ($SiO_x$), and the source/drain metal is molybdenum (Mo), titanium (Ti), tantalum (Ta), or an molybdenum alloy.

In FIG. 3C, a protective film 50 having the first through the fourth contact holes 16, 24, 30, and 38 are formed on the structure shown in FIG. 3B. The protective film 50 is provided by a deposition technique, such as plasma enhanced chemical vapor deposition (PECVD), and is then patterned by photolithography using a third mask and an etch process to define the first to the fourth contact holes 16, 24, 30, and 38. The first contact hole 16 is formed through the protective film 50 to expose a portion of the drain electrode 12. The second contact hole 24 is formed through the protective film 50 to expose a portion the storage electrode 22. The third contact hole 30 is formed through the protective film 50 and through the gate insulating film 44 to expose a portion of the gate pad 28. The fourth contact hole 38 is formed through the protective film 50 to expose a portion of the data pad 36. The protective film 50 is made from an inorganic material that is identical to the gate insulating film 44, or from an organic material having a small dielectric constant, such as an acrylic organic compound, BCB(benzocyclobutene) or PFCB(perfluorocyclobutane).

In FIG. 3D, transparent electrode patterns are provided on the protective film 50. A transparent electrode material is deposited onto the structure shown in FIG. 3C using a deposition technique, such as sputtering. Then, the transparent electrode material is patterned by photolithography using a fourth mask and an etching process to provide the transparent electrode patterns. That pattern includes the pixel electrode 18, the gate pad protection electrode 32, and the data pad protection electrode 40, wherein the pixel electrode 18 is electrically connected via the first contact hole 16 to the drain electrode 12, and to the storage electrode 22 via the second contact hole 24. In addition, the pixel electrode 18 overlaps part of the pre-stage gate line 2, the gate pad protection electrode 32 is electrically connected via the third contact hole 30 to the gate pad 28, and the data pad protection electrode 40 is electrically connected via the fourth contact hole 38 to the data pad 36. The transparent electrode material comprises indium-tin-oxide (ITO), tin-oxide (TO), or of indium-zinc-oxide (IZO).

SUMMARY OF THE INVENTION

Accordingly, the present invention is directed to a thin film transistor array substrate, manufacturing method thereof, and mask that substantially obviates one or more of the problems due to limitations and disadvantages of the related art.

An object of the present invention is to provide a thin film transistor array substrate, and a manufacturing method thereof that implements a three-mask process, thereby reducing manufacturing cost and improving yield.

Another object of the present invention is to provide a mask applied to the thin film transistor array substrate and the manufacturing method thereof using the three-mask process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor array substrate including a gate pattern having a gate electrode, a gate line connected to the gate electrode, and a gate pad connected to the gate line, a source/drain pattern having a source electrode, a drain electrode, a data line connected to the source electrode, and a data pad connected to the data line, a gate insulating pattern formed along a matrix pattern including the gate pattern and the source/drain pattern except for a pixel area, a semiconductor pattern formed on the gate insulating pattern having a same pattern as the gate insulating pattern and partially removed at a thin film transistor area and the gate line area, and a transparent electrode pattern having a pixel electrode formed at the pixel area and connected to the drain electrode, a gate pad protective electrode formed on the gate pad, and a data pad protective electrode formed on the data pad.

In another aspect, a manufacturing method for a thin film transistor array substrate includes forming a first mask including gate patterns having a gate electrode, a gate line connected to the gate electrode, and a gate pad connected to the gate line on a substrate, forming a second mask including a gate insulating pattern at an area that covers the gate patterns and where a source/drain pattern is formed including an area of a thin film transistor, except for a pixel area, a semiconductor pattern having a same pattern as the gate insulating pattern and partially removed at the area of the thin film transistor area and the gate line, and a source/drain pattern on the semiconductor pattern, having a source electrode and a drain electrode of the thin film transistor, a data line connected to the source electrode, and a data pad connected to the data line, and forming a third mask of a transparent electrode pattern having a pixel electrode formed at the pixel area and connected to the drain electrode, a gate pad protective electrode formed on the gate pad, and a data pad protective electrode formed on the data pad.

In another aspect, a mask includes a transparent mask substrate, a shielding part formed on the transparent mask substrate for intercepting incident light, and at least two partial exposure portions formed on the mask substrate, each having different light transmittances.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 7B is a cross sectional view of the exemplary second mask process of FIG. 7A along II–II' according to the present invention;

FIGS. 9A to 9D are cross sectional views of the exemplary second masking process of FIG. 7B along II–II' according to the present invention;

DETAILED DESCRIPTION OF THE PREFERRED EMBODIMENTS

Reference will now be made in detail to the preferred embodiments of the present invention, examples of which are illustrated in the accompanying drawings.

Figure 1:
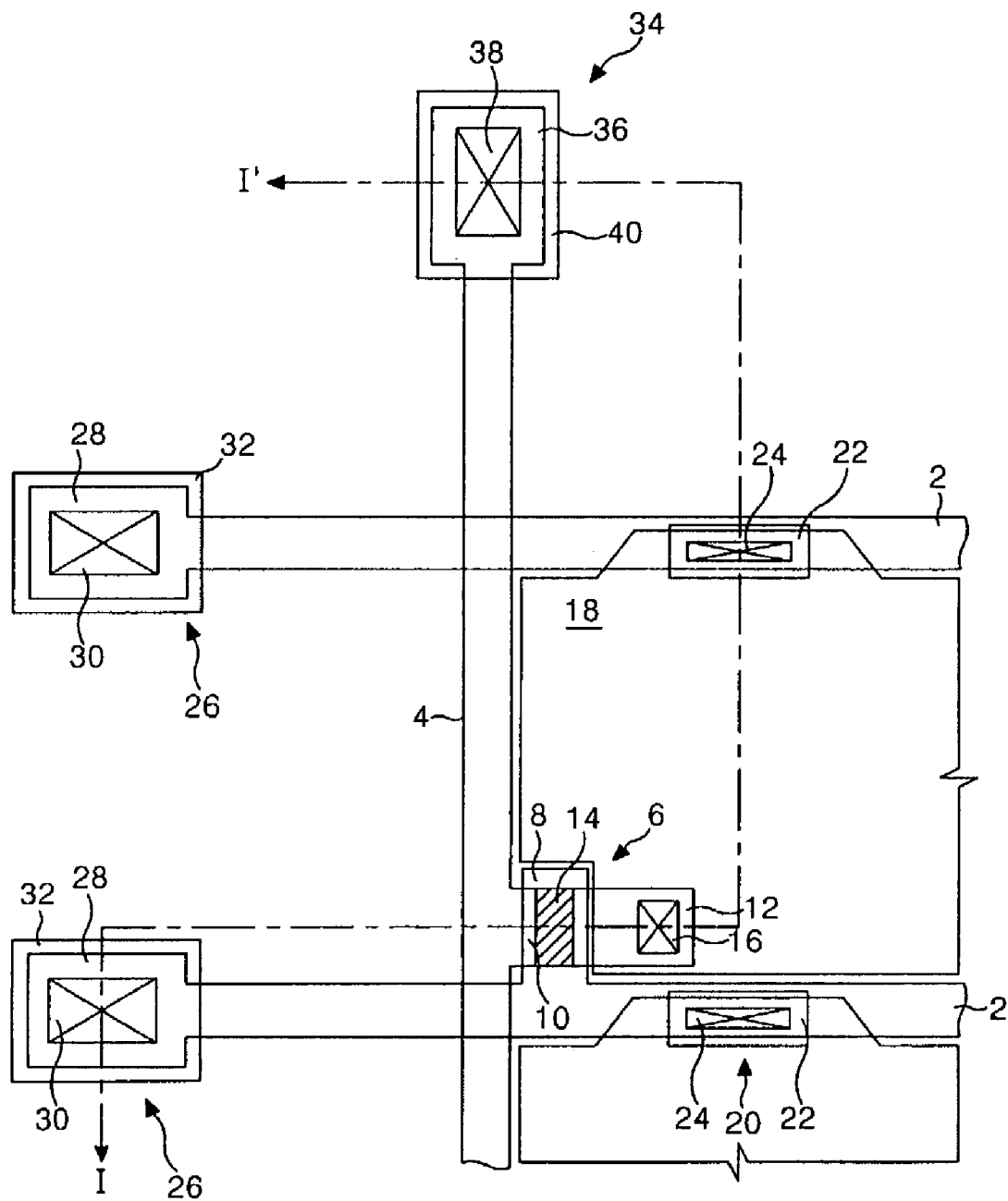
FIG. 1 is a partial plan view of a thin film transistor array substrate according to the related art.
Figure 2:
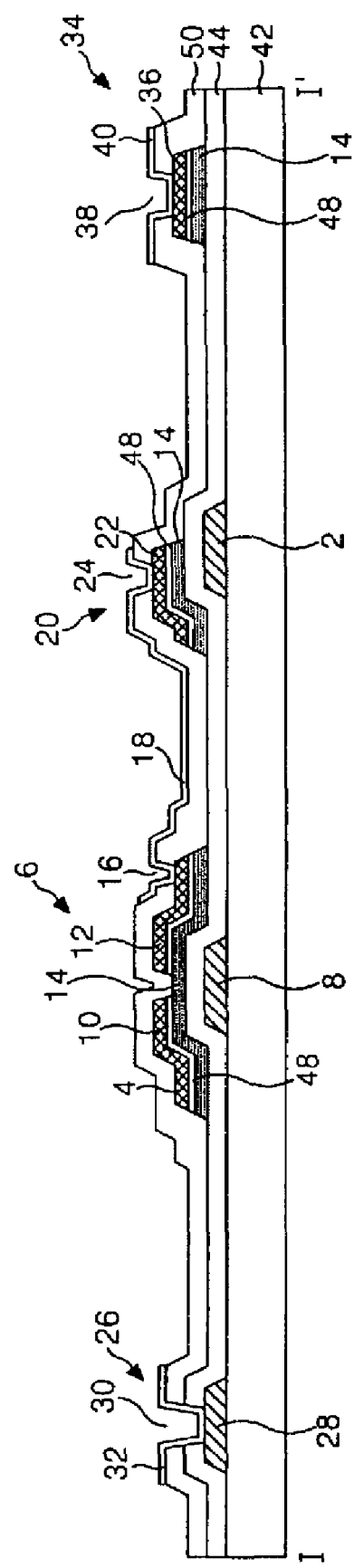
FIG. 2 is a cross sectional view of the thin film transistor array substrate of FIG. 1 along I–I' according to the related art.
Figure 3A:
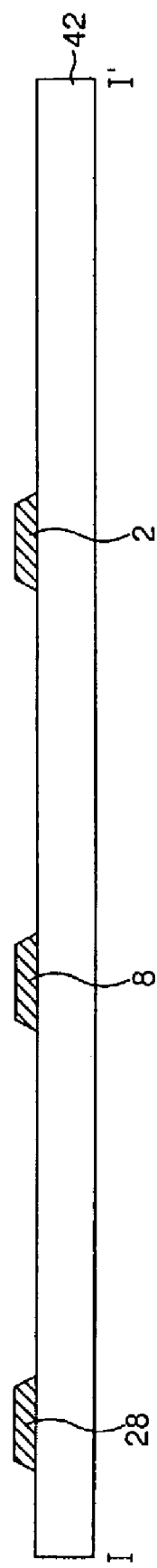
FIGS. 3A to 3D are cross sectional views illustrating a method of manufacturing the thin film transistor array substrate shown in FIG. 2 according to the related art.
Figure 3B:
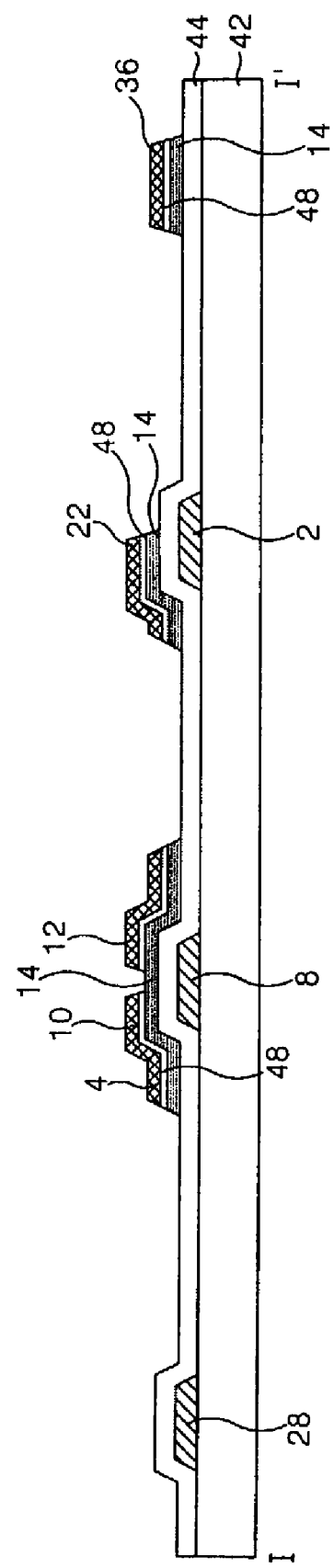
Figure 3C:
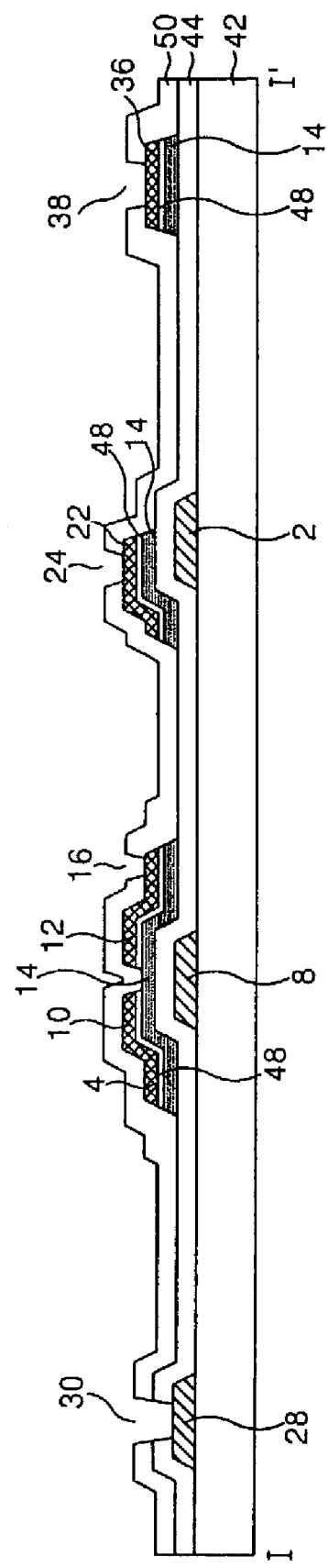
Figure 3D:
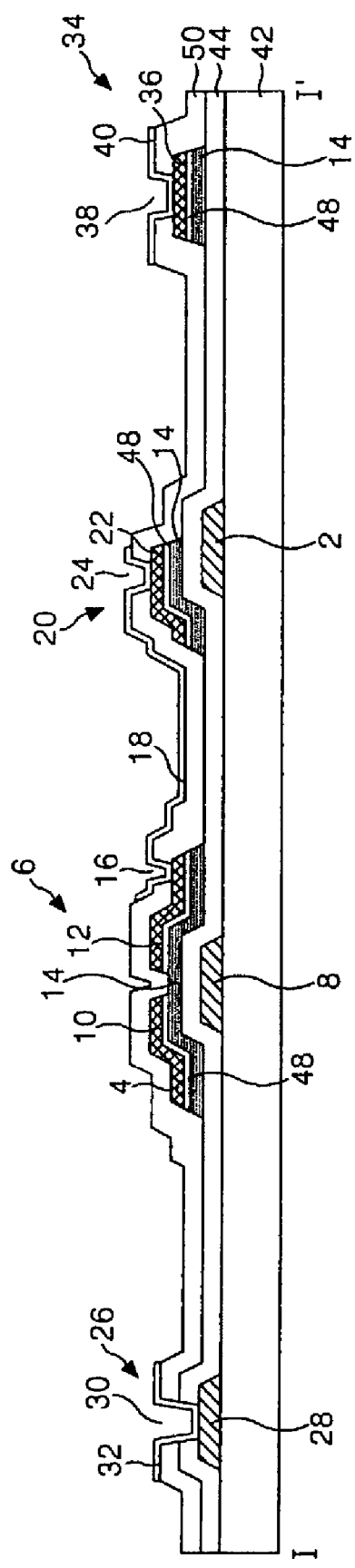
Figure 4:
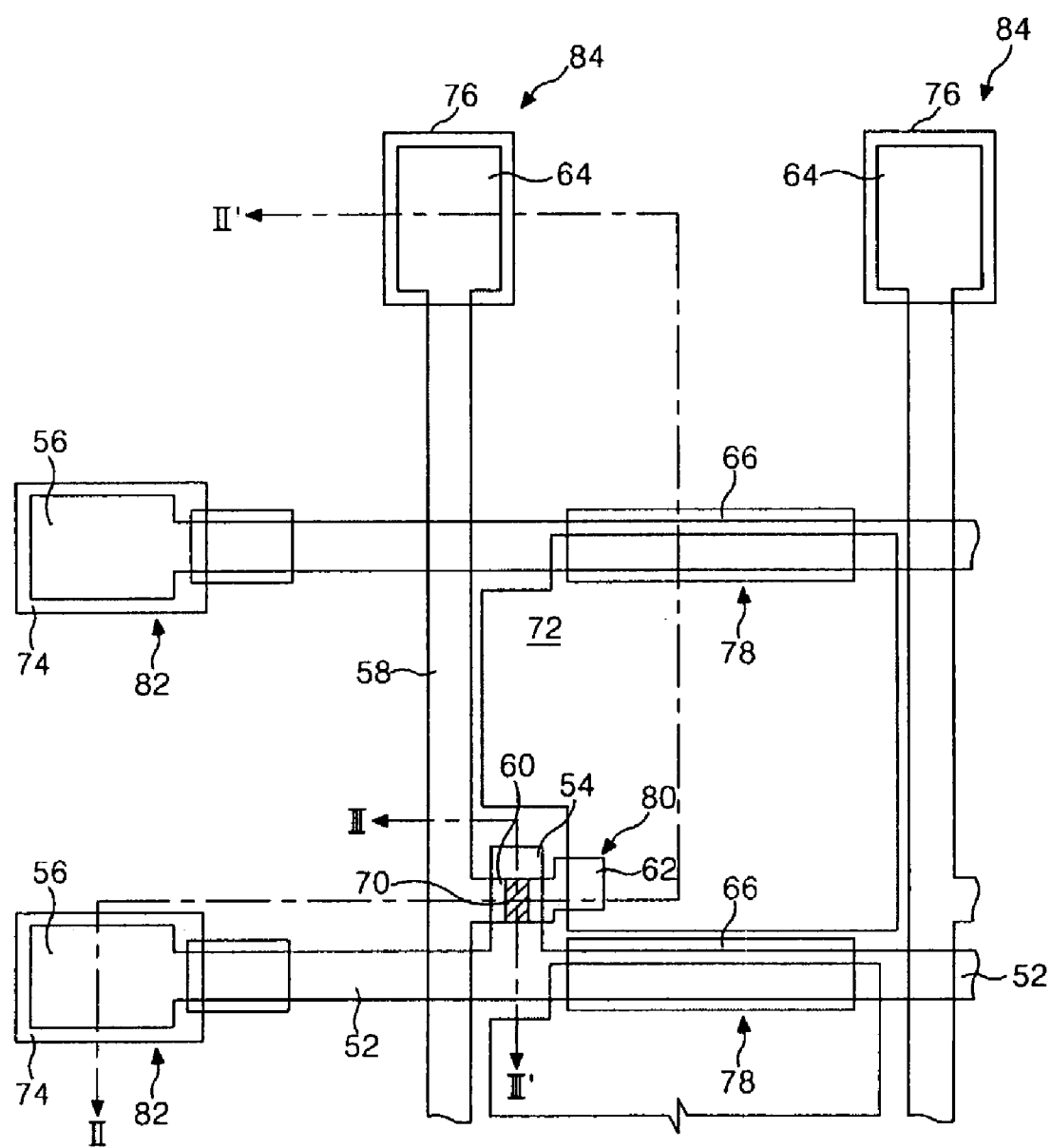
FIG. 4 is a partial plan view of an exemplary thin film transistor array substrate according to the present invention.
Figure 5:
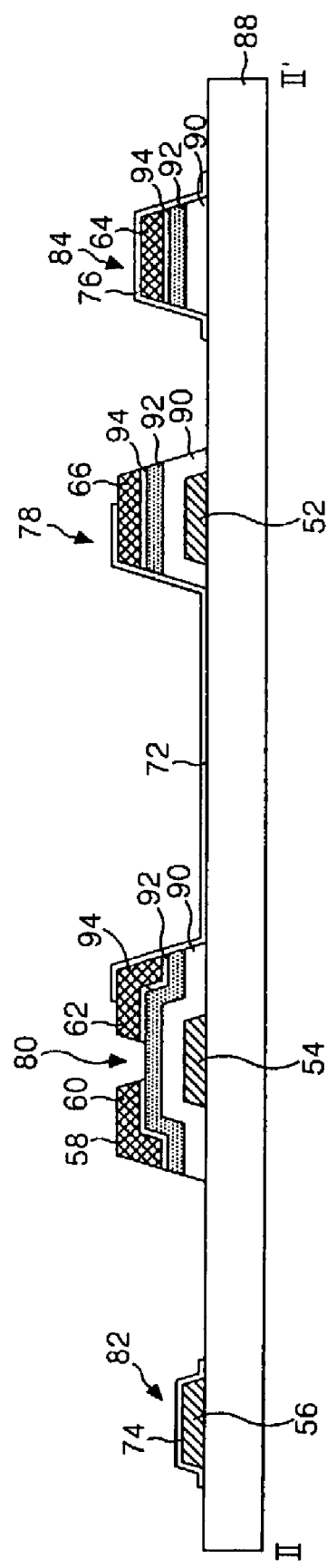
FIG. 5 is a cross sectional view of the exemplary thin film transistor array substrate of FIG. 4 along II–II' according to the present invention.

FIG. 4 is a partial plan view of an exemplary thin film transistor array substrate according to the present invention, and FIG. 5 is a cross sectional view of the exemplary thin film transistor array substrate of FIG. 4 along II–II' according to the present invention. In FIGS. 4 and 5, a thin film transistor array substrate may include gate lines 52 and data lines 58 on a lower substrate 88, whereby a gate insulating pattern 90 may electrically insulate crossings of the gate and data lines 52 and 58. A thin film transistor 80 may be provided at each intersection of the gate and data lines 52 and 58, and a pixel electrode 72 may be provided within each liquid crystal cell defined by the crossing of the gate and data lines 52 and 58. The thin film transistor array substrate may further include storage capacitors 78 at portions of the (pre-stage) gate lines 52 that are overlapped by the pixel electrodes 72. In addition, gate pad portions 82 may be connected to the gate lines 52, and data pad portions 84 may be connected to the data lines 58.

Each thin film transistor 80 may include a gate electrode 54 connected to a gate line 52, a source electrode 60 connected to a data line 58, a drain electrode 62 connected to a pixel electrode 72, and a semiconductor pattern that overlaps the gate electrode 54. The semiconductor pattern may include at least an active layer 92 for defining a channel 70 between the source electrode 60 and the drain electrode 62. In addition, a portion of the gate insulating pattern 90 may be disposed between the semiconductor pattern and the gate electrode 54. Accordingly, the thin film transistor 80 may switch a pixel voltage signal transmitted along the data line 58 to the pixel electrode 72 and into the storage capacitors 78 in response to gate signals transmitted along the gate line 52.

In addition, the semiconductor pattern may include an ohmic contact layer 94, and the active layer 92 may form a channel between the source electrode 60 and the drain electrode 62. The semiconductor pattern may be overlapped by the data line 58 and a data pad 64, and portions of the ohmic contact layer 94 and active layer 92 may be overlapped by the storage electrode 66, whereby those portions may overlap the gate insulating patterns 90 disposed over the gate lines 52. The ohmic contact layer 94 may provide ohmic contact with the storage electrode 66, the data line 58, the source electrode 60, the drain electrode 62, and the data pad 64. The semiconductor pattern may be formed in such a manner as to overlap the gate line 52 and a corresponding portion of the gate insulating pattern 90, wherein the semiconductor pattern may be removed in regions between the liquid crystal cells, i.e., the data lines 58, and the gate insulating pattern 90 only should be left. Accordingly, the regions between the liquid crystal cells may prevent signal interference between liquid crystal cells caused by the semiconductor pattern itself.

In FIGS. 4 and 5, the pixel electrode 72 may be connected along side surfaces of the drain electrode 62, the ohmic contact layer 94, the active layer 92, and the gate insulating pattern 90 of the thin film transistor 80. The voltage on the pixel electrode 72 produces a potential difference with respect to a common electrode formed on an upper substrate (not shown) when a pixel voltage is applied to the pixel electrode 72. This potential difference rotates liquid crystals (not shown) disposed between the thin film transistor substrate, i.e., lower substrate 88, and the upper substrate due to dielectric anisotropy of the liquid crystals. Accordingly, the liquid crystals control transmission of light produced from a light source (not shown) positioned beneath the lower substrate 88 that passes through the pixel electrode 72 toward the upper substrate (not shown).

Each of the storage capacitors 78 may be associated with a pre-stage gate line 52, i.e., the gate line 52 that is associated with the thin film transistors that are turned ON in the previous gate drive period. The storage electrode 66 may overlap the gate line 52, the gate insulating pattern 90, the active layer 92, and the ohmic contact layer 94 that are disposed over the gate line 52, and the storage electrode 66 may be connected to the pixel electrode 72. In addition, the storage capacitor 78 may retain the pixel voltage on the pixel electrode 72 until the next pixel voltage is applied.

The gate line 52 may be connected, via the gate pad portion 82, to a gate driver (not shown), wherein the gate pad portion 82 may include a gate pad 56 that extends from the gate line 52, and a gate pad protective electrode 74 that is connected to the gate pad 56. The data line 58 may be connected, via the data pad portion 84, to a data driver (not shown), wherein the data pad portion 84 may include a data pad 64 that extends from the data line 58, and a data pad protective electrode 76 that is connected to the data pad 64. In addition, the data pad portion 84 may include the gate insulating pattern 90, the active layer 92, and the ohmic contact layer 94 stacked between the data pad 64 and the lower substrate 88.

Figure 6A:
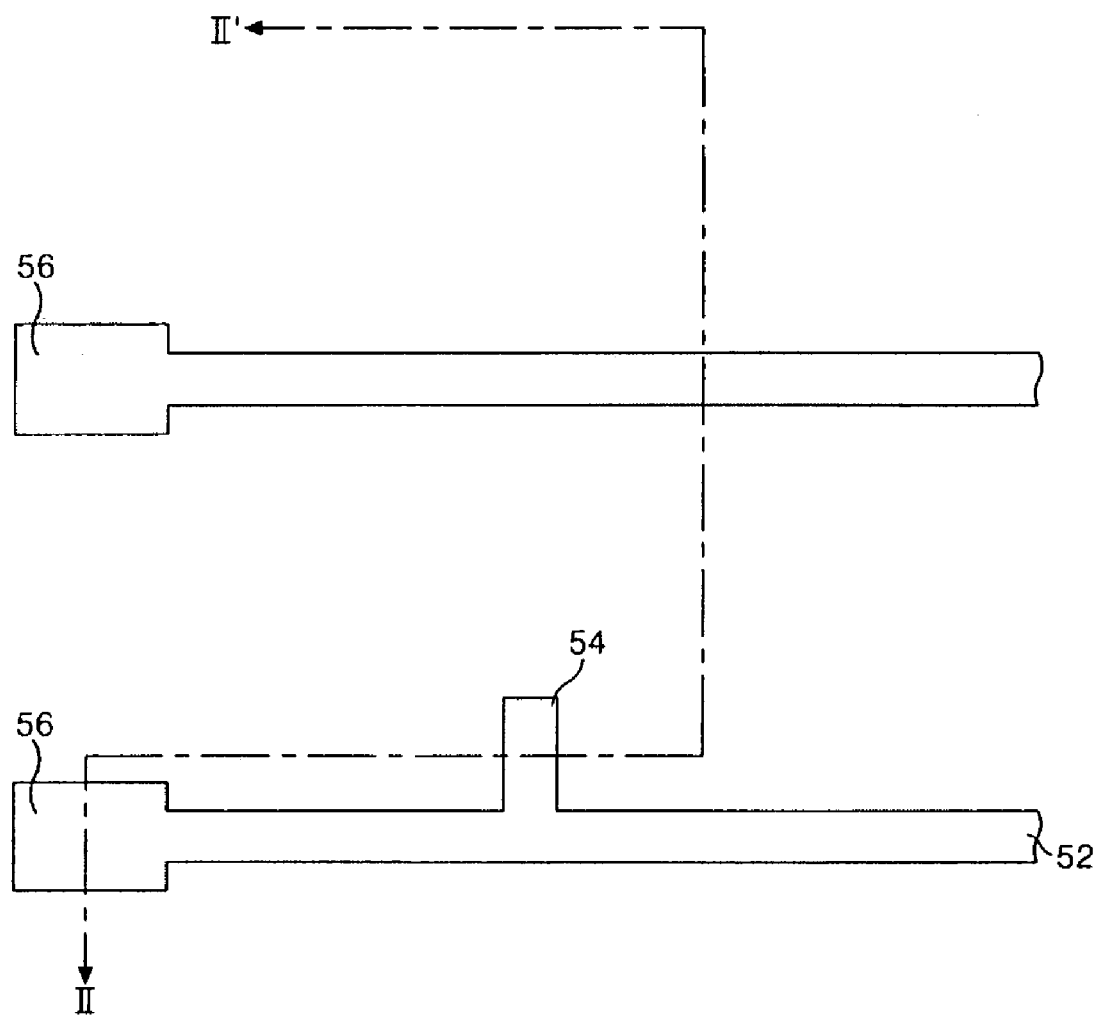
FIG. 6A is a partial plan view of an exemplary first masking process according to the present invention.
Figure 6B:
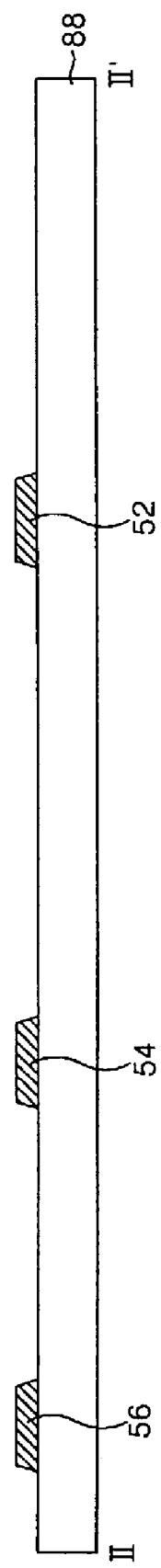
FIG. 6B is a cross sectional view of the exemplary first masking process of FIG. 6A along II–II' according to the present invention.

FIG. 6A is a partial plan view of an exemplary first masking process according to the present invention, and FIG. 6B is a cross sectional view of the exemplary first masking process of FIG. 6A along II–II' according to the present invention. In FIGS. 6A and 6B, a gate metal layer may be formed on a lower substrate 88 by a deposition technique, such as sputtering. Then, the gate metal layer may be patterned by a photolithographic process using a first mask, and then etching the gate metal layer to form gate patterns. The gate patterns may include gate line 52, gate electrode 54 and gate pad 56. The gate metal layer may include at least one of Cr, MoW, Cr/Al, Cu, Al(Nd), Mo/Al, Mo/Al(Nd), and Cr/Al(Nd).

Figure 7A:
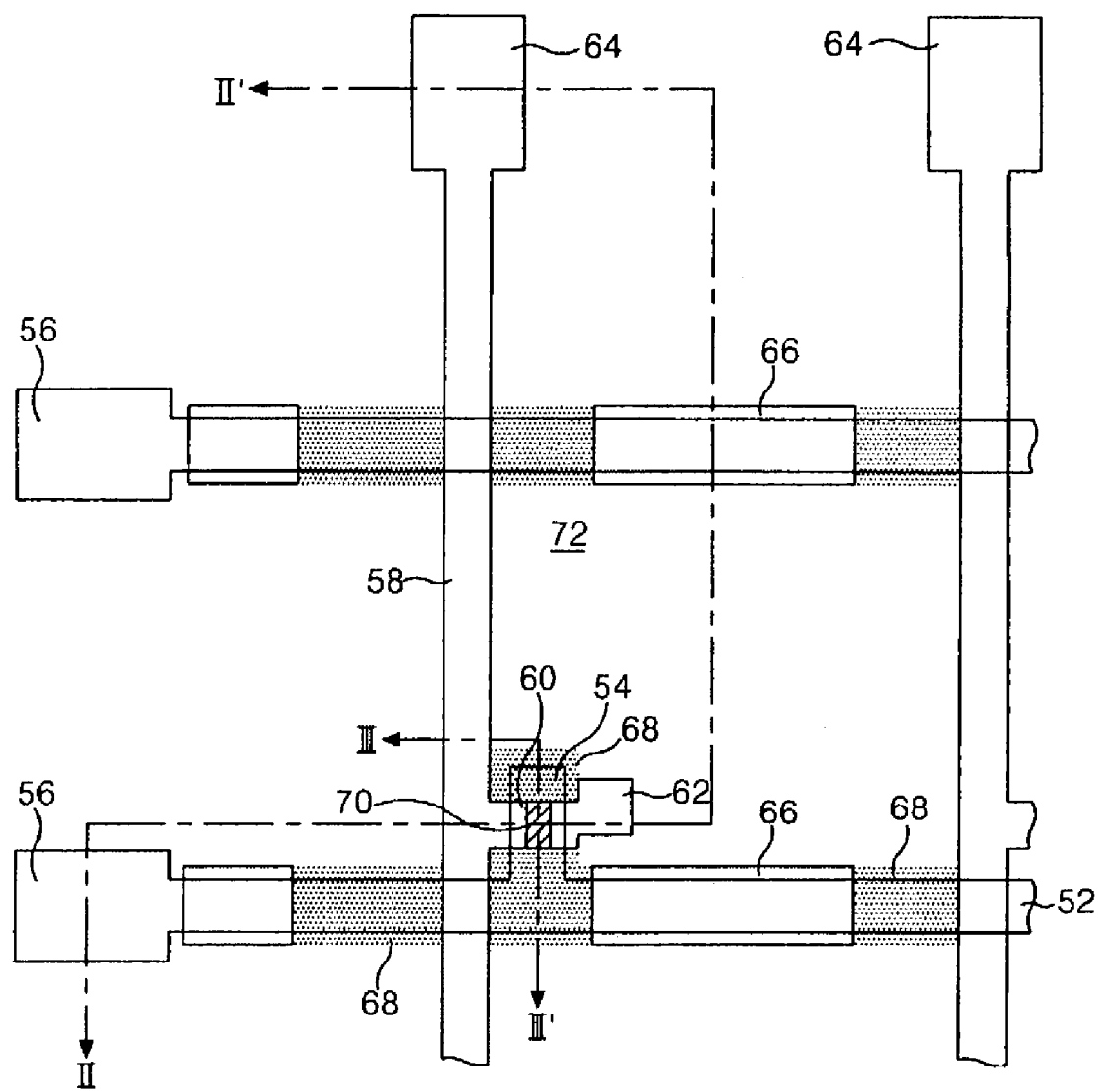
FIG. 7A is a partial plan view of an exemplary second masking process according to the present invention.

FIG. 7A is a partial plan view of an exemplary second masking process according to the present invention, and FIG. 7B is a cross sectional view of the exemplary second mask process of FIG. 7A along II–II' according to the present invention. In FIGS. 7A and 7B, a gate insulating layer, an undoped amorphous silicon layer, an n$^+$ amorphous silicon layer, and a source/drain metal layer may be sequentially deposited using plasma enhanced chemical vapor deposition (PECVD) or sputtering, for example. The gate insulating layer may include an inorganic insulating materials, such as silicon nitride ($SiN_x$) or silicon oxide ($SiO_x$), and the source/drain metal layer may include Cr, MoW, Cr/Al, Cu, Al(Nd), Mo/Al, Mo/Al(Nd), and Cr/Al(Nd), for example.

Then, the source/drain metal layer, the n$^+$ amorphous silicon layer, the undoped amorphous silicon layer, and the gate insulating layer may be patterned by using a photolithographic process using a second mask and a plurality of ashings and etchings to produce the gate insulating pattern 90, the semiconductor pattern, and the source/drain pattern. The semiconductor pattern may include an active layer 92 and an ohmic contact layer 94, and the source/drain pattern may produce and include a source electrode 60, a drain electrode 62, a data line 58, a storage electrode 66, and a data pad 64.

The gate insulating pattern 90 may be formed along the gate patterns in such a manner that the gate patterns are not exposed and at an area where the source/drain patterns are formed crossing the gate patterns.

The semiconductor pattern and the source/drain pattern may be formed with a similar pattern as the gate insulating pattern 90, and may be partially removed at the thin film transistor area and the gate line 52 area. Accordingly, the gate insulating pattern 90 may remain. In addition, an area 68 where the semiconductor and source/drain patterns are removed may correspond to the remaining gate insulating pattern 90, excluding an area where the channel 70 and the source and drain electrodes 60 and 62 may be formed from the thin film transistor area. Thus, light-induced leakage current may be reduced due to activation of the semiconductor pattern by light when the semiconductor pattern is exposed to the light.

Further, the area 68 where the semiconductor source/drain patterns are removed in the gate line 52 area may correspond to portions between the liquid crystal cells, i.e., the data lines 58, to prevent short circuit and signal interference between the data lines 58 caused by the semiconductor and source/drain patterns overlapping the gate line 52. Moreover, the source/drain pattern may be additionally removed from the channel 70 of the thin film transistor to expose the ohmic contact layer 94 of the semiconductor pattern. A partial exposure mask may be used as the second mask in order to selectively remove the semiconductor and source/drain patterns. Accordingly, a photo-resist pattern patterned by the partial exposure mask may have a two-step form.

Figure 8A:
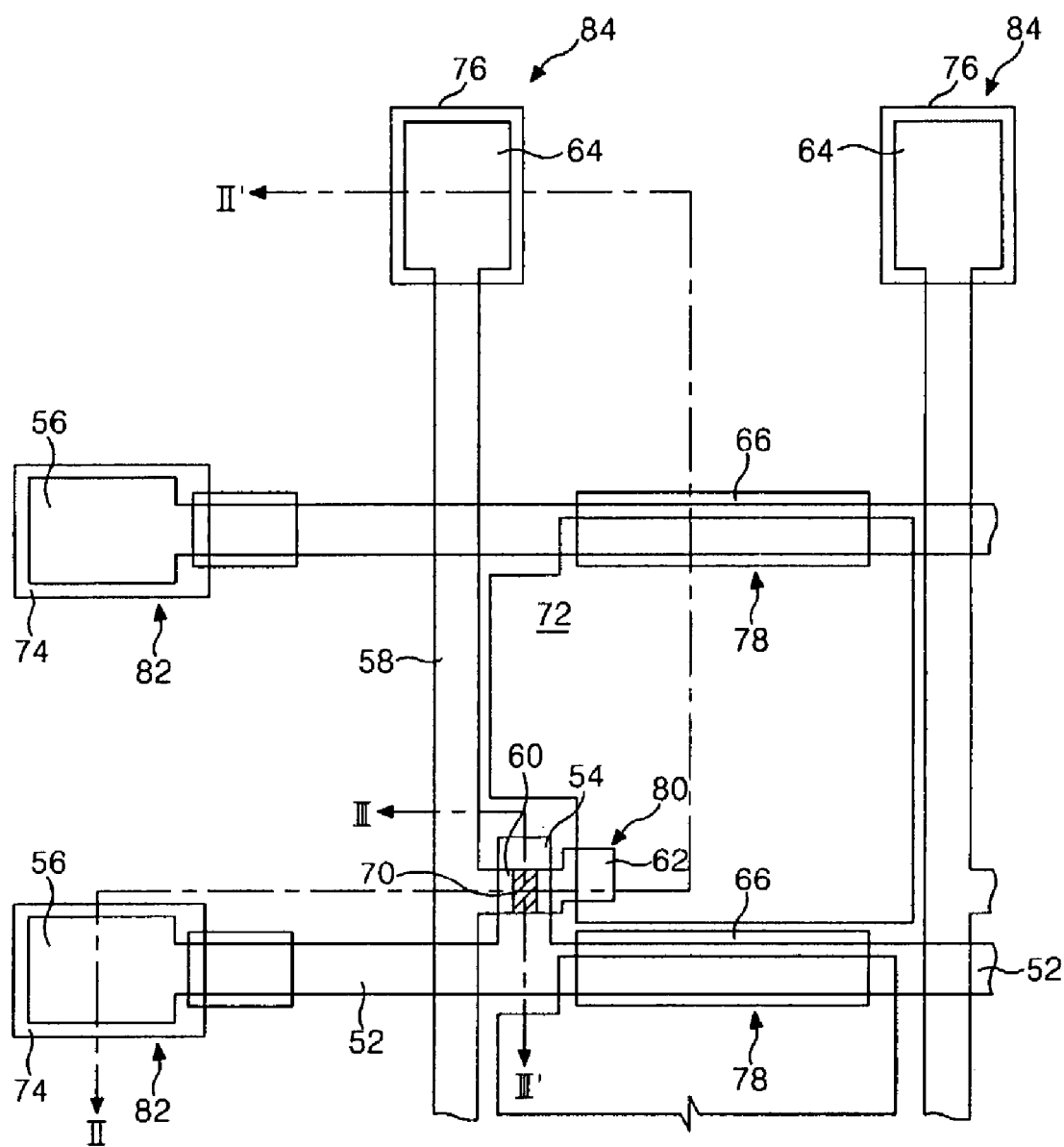
FIG. 8A is a partial plan view of an exemplary third masking process according to the present invention.
Figure 8B:
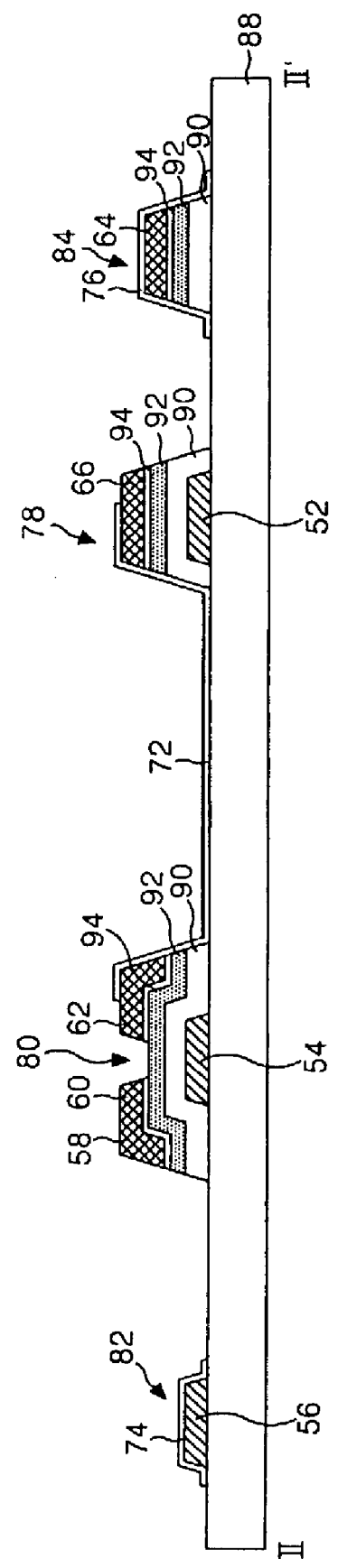
FIG. 8B is a cross sectional view of the exemplary third mask process of FIG. 7A along II–II' according to the present invention.

FIG. 8A is a partial plan view of an exemplary third masking process according to the present invention, and FIG. 8B is a cross sectional view of the exemplary third mask process of FIG. 7A along II–II' according to the present invention. In FIGS. 8A and 8B, a transparent electrode material may be deposited onto an entire surface of the lower substrate 88, where the source/drain pattern may be formed, by a deposition technique, such as sputtering. Subsequently, the transparent electrode material may be patterned through photolithographic and etching processes using a third mask to form the transparent electrode patterns including a pixel electrode 72, a gate pad protective electrode 74, and a data pad protective electrode 76. The pixel electrode 72 may be electrically connected to the drain electrode 62, and a pre-stage gate line 52 may be formed to overlap with and connect to the storage electrode 66. The gate pad protective electrode 74 may be formed on top of the gate pad 56 to provide protection, and the data pad protective electrode 76 may be formed on top of the data pad 64 for protection. Here, the transparent electrode material may include indium tin oxide ITO, tin oxide TO, or indium zinc oxide IZO, for example. Then, after the transparent electrode pattern is formed, the ohmic contact layer 94 of the channel 70 may be removed using a dry-etching process, for example, using the source electrode 60 and the drain electrode 62 as a mask.

An alignment film may be provided to determine an alignment direction of liquid crystals using the following process. The alignment film protects the thin film transistor array substrate formed by the third mask process. A source/drain metal layer, an n+ amorphous silicon layer, an undoped amorphous silicon layer, and a gate insulating layer may be patterned by a photolithographic process using a second mask and a plurality of ashing and etching processes to produce a gate insulating pattern 90, a semiconductor pattern, and a source/drain pattern. The semiconductor pattern may include the active layer 92 and the ohmic contact layer 94, and the source/drain pattern may produce and include the source electrode 60, the drain electrode 62, the data line 58, the storage electrode 66, and the data pad 64.

Figure 9B:
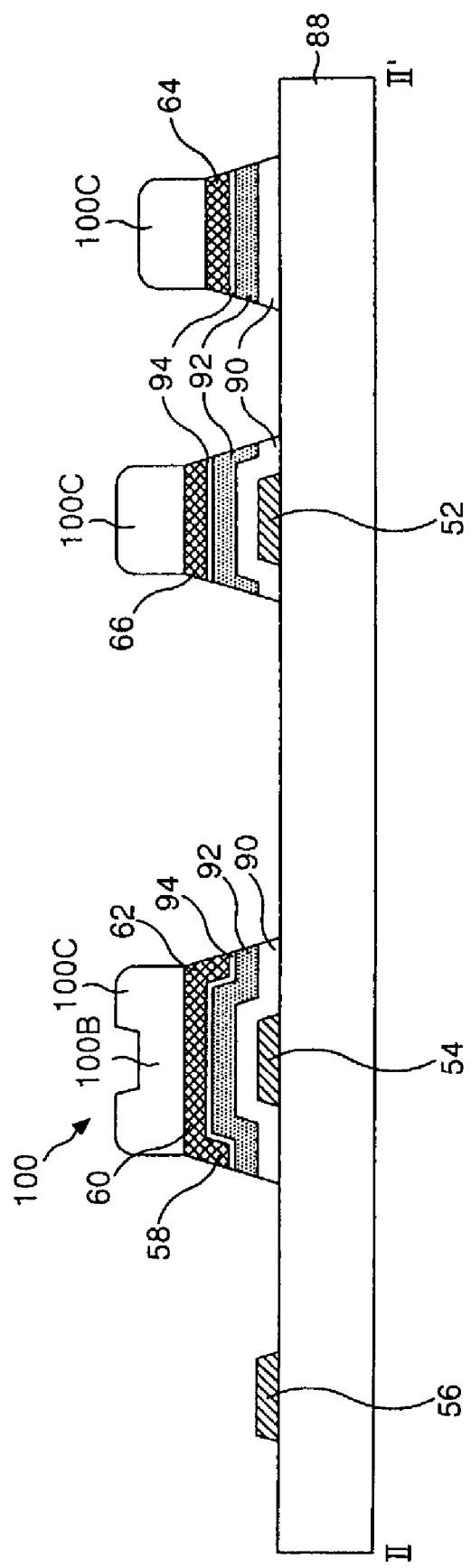
Figure 9C:
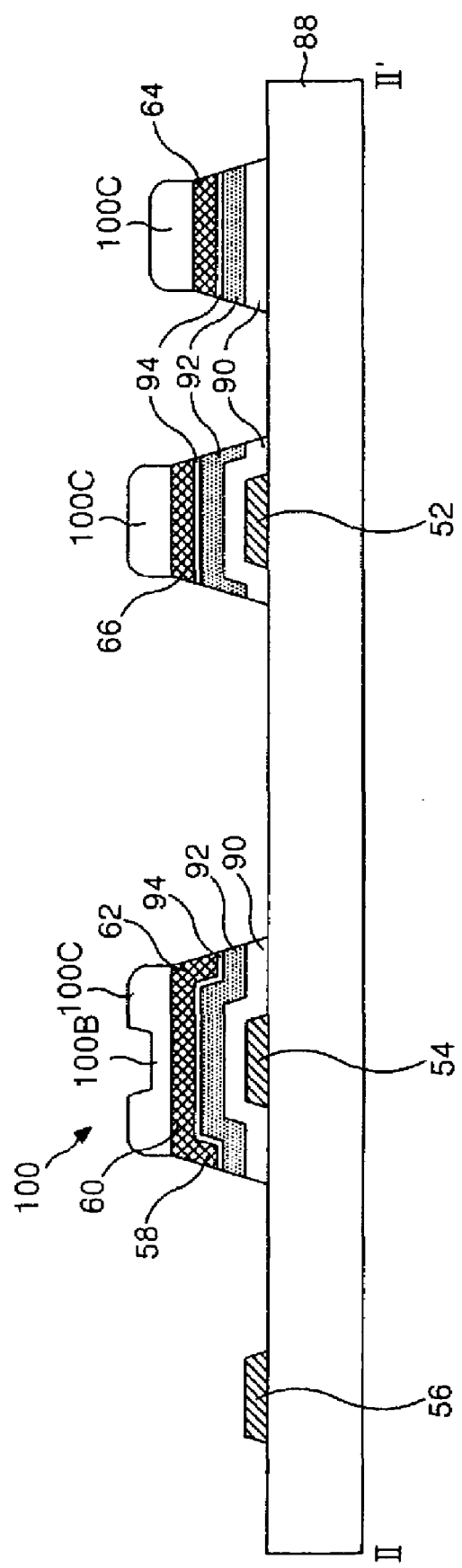
Figure 9D:
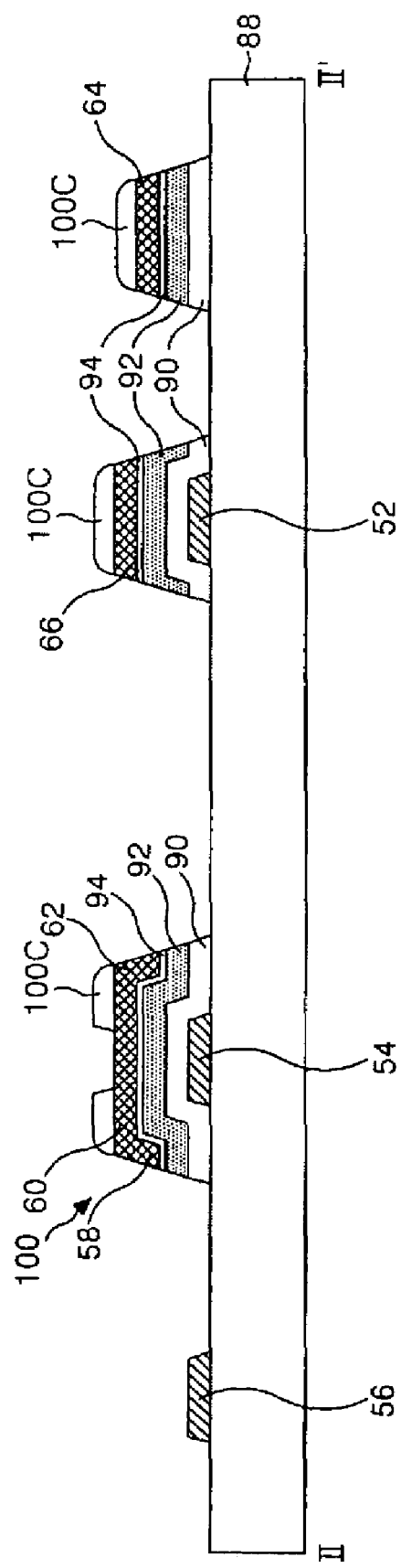
Figure 10A:
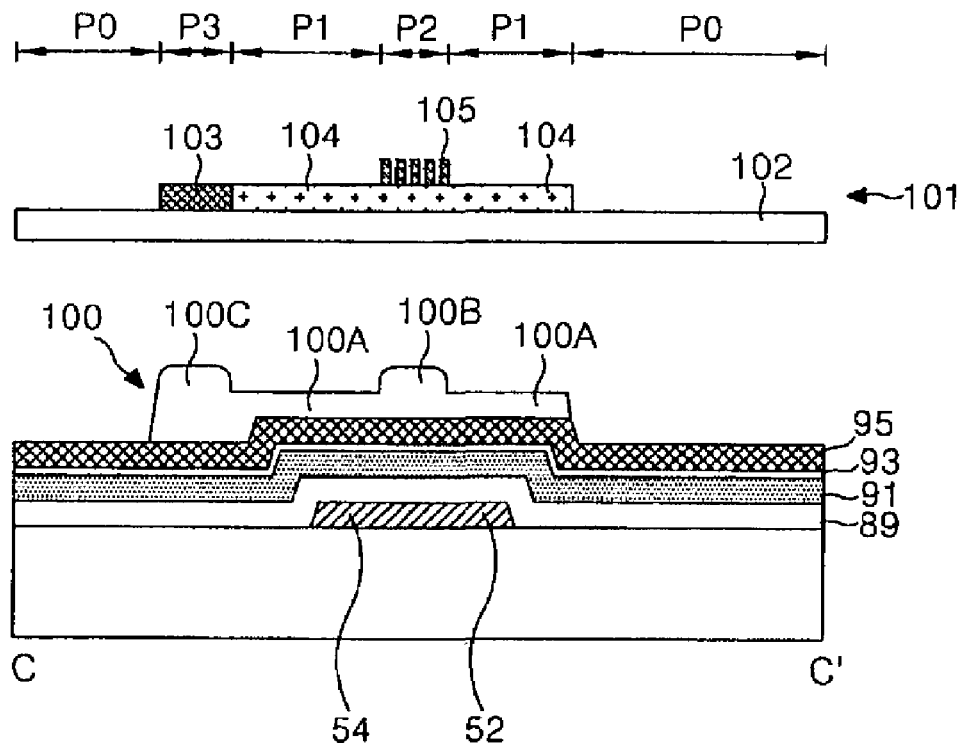
FIGS. 10A to 10D are cross sectional views of an exemplary second mask implemented during the second masking process of FIG. 7A along III–III' according to the present invention.

FIGS. 9A to 9D are cross sectional views of the exemplary second masking process of FIG. 7B along II–II' according to the present invention, and FIGS. 10A to 10D are cross sectional views of an exemplary second mask implemented during the second masking process of FIG. 7A along III–III' according to the present invention. In FIGS. 9A and 10A, a gate insulating layer 89, an amorphous silicon layer 91, an n+ amorphous silicon layer 93, and a source/drain metal layer 95 may be sequentially formed on a lower substrate 88 where gate patterns have been previously formed. Thereafter, a photo-resist may be spread onto an entire surface to form a photo-resist pattern 100 on the source/drain metal layer 95 by a photolithographic process using the second mask 101 as a partial exposure mask.

The second mask 101 may include a partial transmitting layer 104 formed at a first partial exposure area P1 of a transparent mask substrate 102, a partial transmitting layer 104 and diffractive exposure slits 105 formed at a second partial exposure area P2, and a shielding layer 103 formed at a shielding area P3. In addition, the second mask 101 may include a full exposure area P0 that exposes portions of the transparent mask substrate 102. Accordingly, the first and second partial areas P1 and P2 may provide for different amounts of partial exposure. Alternatively, the exposure amounts may be controlled by using transmitting layers, the transmittances of which are different, or controlling the gaps of the diffractive exposure slits besides combining the partial transmitting layer 104 with the diffractive exposure slits 105, as above-described. The transparent mask substrate 102 of the second mask 101 may include quartz (SiO2), the shielding layer 102 and the diffractive exposure slits 105 may include metallic materials, such as chrome Cr, and the partial transmitting layer 104 may include conductive materials, such as MoSix.

During the photolithographic processes using the second mask 101, all the photo-resist fully exposed through the full exposure area P0 of the second mask 101 may be removed. A photo-resist pattern 100 may be formed at areas that are not exposed or are partially exposed through the shielding area P3 and the first and second partial exposure areas P1 and P2. For example, a first part-exposed area 100A that may be partially exposed by a partial transmitting layer 104 of the second mask 101 may be formed with a first height in the photo-resist pattern 100. As compared with the first part-exposed area 100A, a second part-exposed area 100B of the photo-resist pattern 100 where less amount of light is irradiated by the diffractive exposure slits 105 and the partial transmitting layer 104 of the second mask 101 may be formed with a second height higher than the first height. In addition, a shielded area 100C of the photo-resist pattern 100 that is not exposed by a shielding layer 103 of the second mask 101 may have a third height larger than the second height.

Figure 10B:
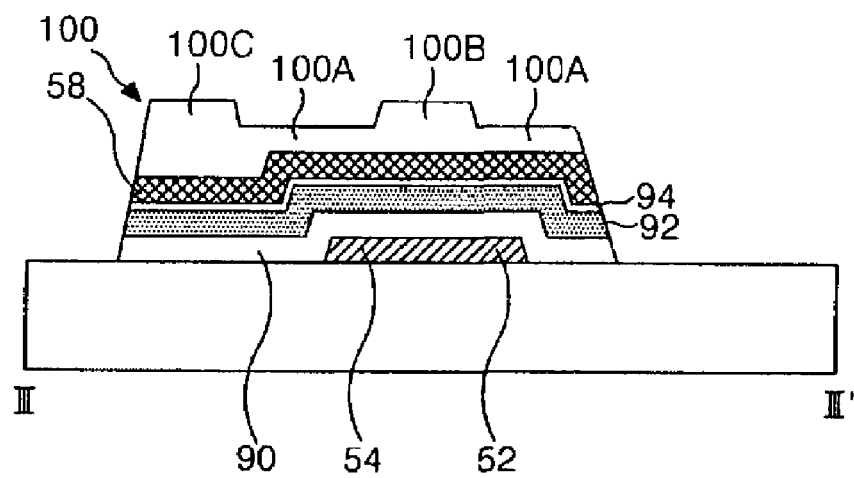

In FIGS. 9B and 10B, a source/drain metal layer 95, an n+ amorphous silicon layer 93, an undoped amorphous silicon layer 91, and a gate insulating layer 89 may be simultaneously patterned by an etching process using the photo-resist pattern 100 as a mask. Accordingly, the semiconductor pattern that includes the active and ohmic contact layers 92 and 94, and the source/drain pattern that includes the data line 58, the source electrode 60, the drain electrode 62, the storage electrode 66, and the data pad 64 may be formed to have a similar pattern as the gate insulating pattern 90.

Figure 10C:
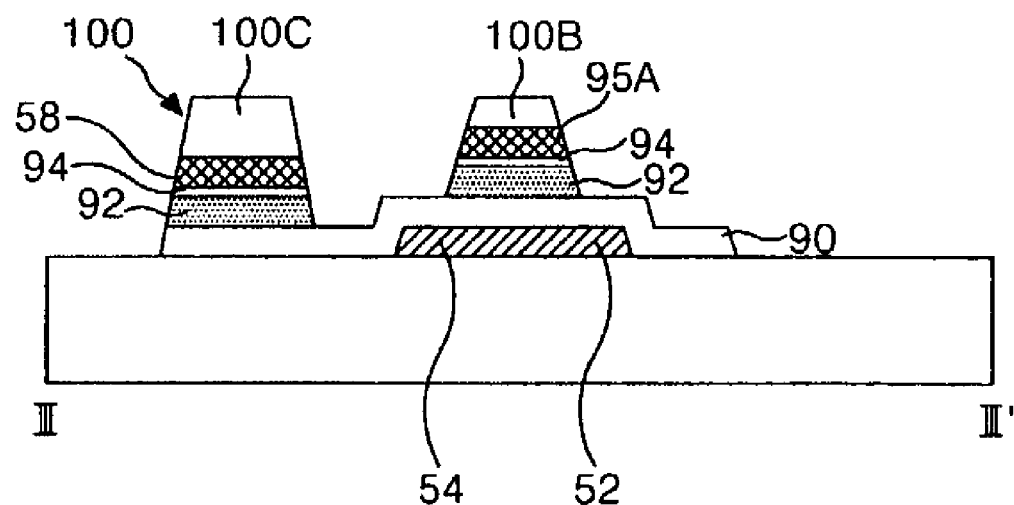

In FIGS. 9C and 10C, the first part-exposed area 100A having the first height, which is the lowest within the photo-resist pattern 100, may be removed, and the second part-exposed area 100B and the shielded area 100C may remain although lowered by a designated height by the first ashing process using an oxygen O2 plasma, for example. The source/drain pattern and the semiconductor pattern may be partially removed by an etching process using the photo-resist pattern 100 where the first part-exposed area 100A is removed. Thus, the area where the source/drain and semiconductor patterns are removed, as shown in FIG. 7A, may correspond to the remaining area 68 except for the area where the channel 70 and the source and drain electrode 60 and 62 are formed in the thin film transistor area, and a portion 68 of the gate line 52 area for the open between the data lines 58.

Figure 10D:
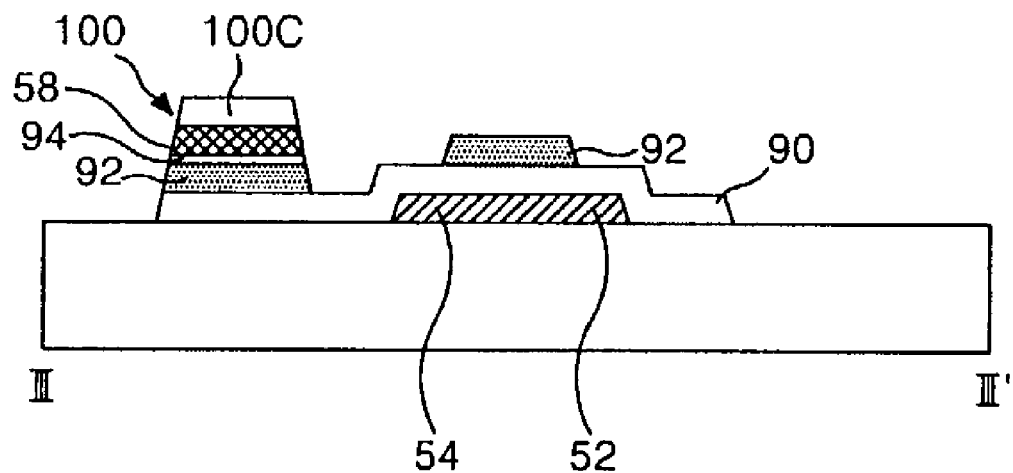

In FIGS. 9D and 10D, the second part-exposed area 100B, which has been lowered by a designated height by the first ashing process in the photo-resist pattern 100, may be removed, and the shielded area 100C remains although being reduced by an amount more than the designated height, by the second ashing process using an oxygen O2 plasma, for example. The source and drain pattern may be removed from a channel region of the thin film transistor by an etching process using the second part-exposed area 100B, whereby the source electrode 60 and the drain electrode 62 are separated. In addition, the shielded area 100C of the photo-resist pattern 100 may be removed by a stripping process, for example.

Figure 11:
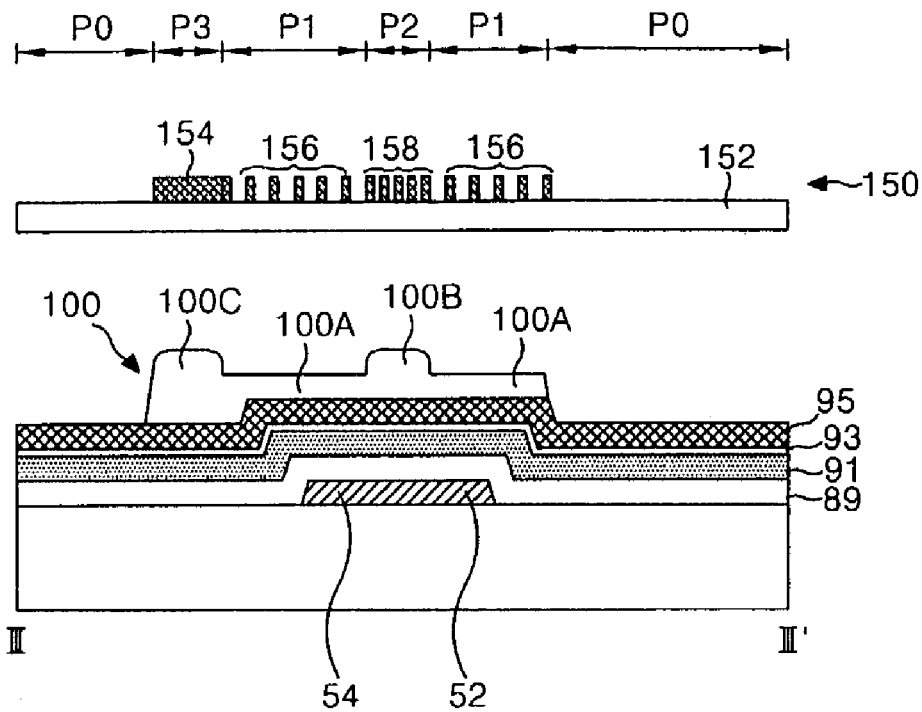
FIG. 11 is a cross sectional view another exemplary second mask implemented during the second masking process according to present invention.

FIG. 11 is a cross sectional view another exemplary second mask implemented during the second masking process according to present invention. In FIG. 11, a second mask 150 may include first diffractive exposure slits 156 formed for each first gap at first partial exposure areas P1 of a mask substrate 152, second diffractive exposure slits 158 formed at a second partial exposure area P2 for each second gap that is narrower than the first gap, and a shielding layer 154 formed at a shielding area P3. In addition, the second mask 150 may include full exposure areas P0 to prevent exposure of the mask substrate 152. The transparent mask substrate 152 of the second mask 150 may include quartz (SiO2), and the shielding layer 154 and the first and second diffractive exposure slits 156 and 158 may include metallic materials, such as chrome (Cr).

During photolithographic processes using the second mask 150, any photo-resist fully exposed through the full exposure areas P0 of the second mask 150 may be removed. A photo-resist pattern 100 may be formed within areas that are not exposed or are partially exposed through the shielding area P3 and the first and second partial exposure areas P1 and P2. For example, a first part-exposed area 100A that may be partially exposed by the first diffractive exposure slits 156 of the second mask 150 may be formed with a first height in the photo-resist pattern 100. As compared with the first part-exposed area 100A, a second part-exposed area 100B of the photo-resist pattern 100 where less amount of light is irradiated by the second diffractive exposure slits 158 of the second mask 150 may be formed with a second height larger than the first height. In addition, a shielded area 100C of the photo-resist pattern 100 that is not exposed by the shielding layer 154 of the second mask 150 may have a third height larger than the second height.

Figure 12:
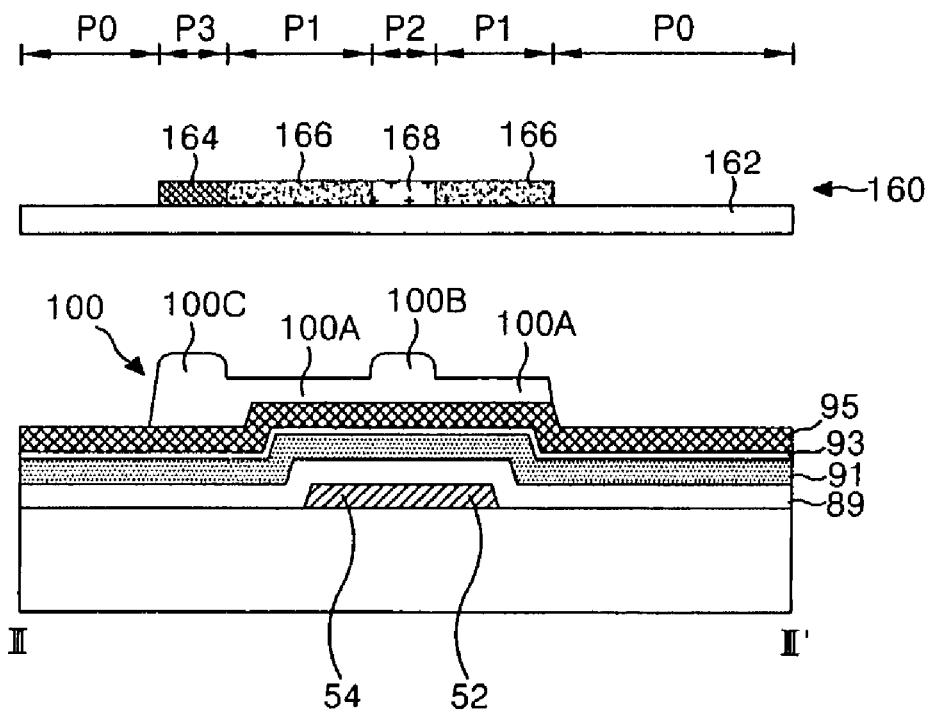
FIG. 12 is a cross sectional view of another exemplary second mask implemented during the second masking process according to the present invention.

FIG. 12 is a cross sectional view another exemplary second mask implemented during the second masking process according to the present invention. In FIG. 12, a second mask 160 may include a first partial transmitting layer 166 formed of a material with a first transmittance at first partial exposure areas P1 of a mask substrate 162, a second partial transmitting layer 168 formed of a material with a second transmittance lower than the first transmittance at a second partial exposure area P2, and a shielding layer 164 formed at a shielding area P3. In addition, the second mask 160 may include full exposure areas P0 to fully expose portions of the mask substrate 162. The transparent mask substrate 162 in the second mask 160 may include quartz (SiO2), the shielding layer 164 may include metallic materials like chrome (Cr), and the first and second partial transmitting layers 166 and 168 may include materials having different transmittances. For example, the first and second partial transmitting layers 166 and 168 may both include MoSix each having different Mo contents. Accordingly, the first partial transmitting layer 166 may include a material having a transmittance higher than the material of the second partial transmitting layer 168.

During photolithographic processes using the second mask 160, any photo-resist fully exposed through the full exposure areas P0 of the second mask 160 may be removed. A photo-resist pattern 100 may be formed within an area that is not exposed or is partially exposed through the shielding area P3 and the first and second partial exposure areas P1 and P2. For example, a first part-exposed area 100A that is partially exposed by the first partial transmitting layer 166 of the second mask 160 may be formed with a first height in the photo-resist pattern 100. As compared with the first part-exposed area 100A, a second part-exposed area 100B of the photo-resist pattern 100 where less amount of light is irradiated by the second partial transmitting layer 166 of the second mask 160 may be formed with a second height larger than the first height. In addition, a shielded area 100C of the photo-resist pattern 100 that is not exposed by the shielding layer 164 of the second mask 160 may have a third height larger than the second height.

Figure 13:
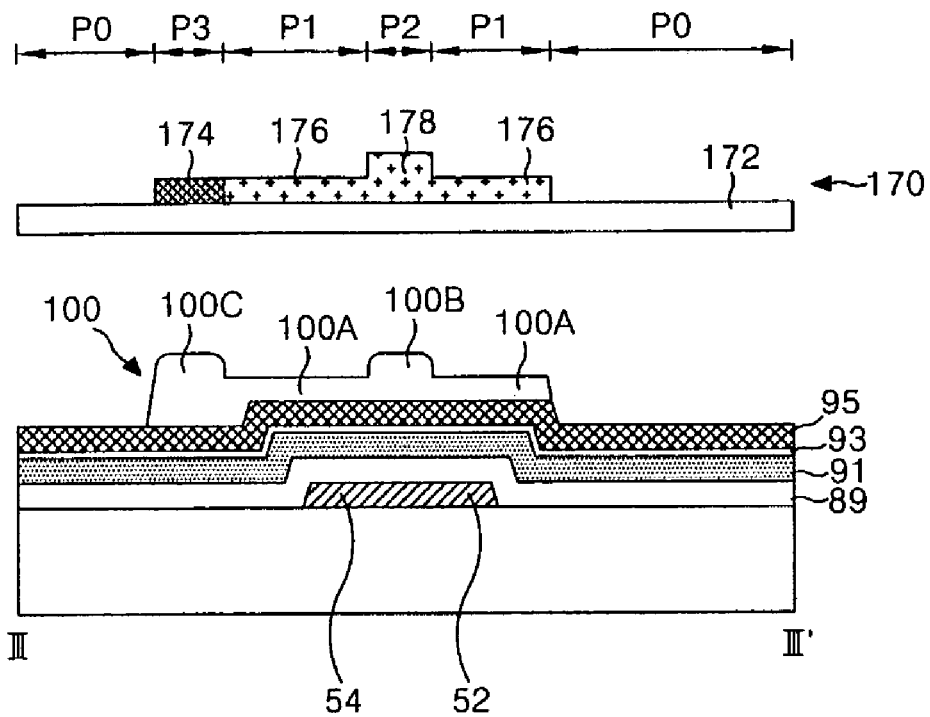
FIG. 13 is a cross sectional view of another exemplary second mask implemented during the second masking process according to the present invention.

FIG. 13 is a cross sectional view of another exemplary second mask implemented during the second masking process according to the present invention. In FIG. 13, a second mask 170 may include a first partial transmitting layer 176 formed with a first thickness at first partial exposure areas P1 of a mask substrate 172, a second partial transmitting layer 178 formed with a second thickness larger than the first thickness at a second partial exposure area P2, and a shielding layer 174 formed at a shielding area P3. In addition, the second mask 170 may include full exposure areas P0 to provide full exposure of the mask substrate 172. The transparent mask substrate 172 in the second mask 170 may include quartz (SiO2), the shielding layer 174 may include metallic materials, such as chrome (Cr), and the first and second partial transmitting layers 176 and 178 may include materials, such as MoSix. For example, the first partial transmitting layer 176 may have a height lower than a height of the second partial transmitting layer 178. Accordingly, the first partial transmitting layer 176 may have a transmittance relatively larger than a transmittance of the second partial transmitting layer 178.

During photolithographic processes using the second mask 170, any photo-resist fully exposed through the full exposure areas P0 of the second mask 170 may be removed. A photo-resist pattern 100 may be formed within an area that is not exposed or is partially exposed through the shielding area P3 and the first and second partial exposure areas P1 and P2. For example, a first part-exposed area 100A that is partially exposed by the first partial transmitting layer 176 of the second mask 170 may be formed with a first height in the photo-resist pattern 100. As compared with the first part-exposed area 100A, a second part-exposed area 100B of the photo-resist pattern 100 where less amount of light is irradiated by the second partial transmitting layer 178 of the second mask 170 may be formed with a second height larger than the first height. In addition, a shielded area 100C of the photo-resist pattern 100 that is not exposed by the shielding layer 174 of the second mask 170 may have a third height larger than the second height.

Figure 14:
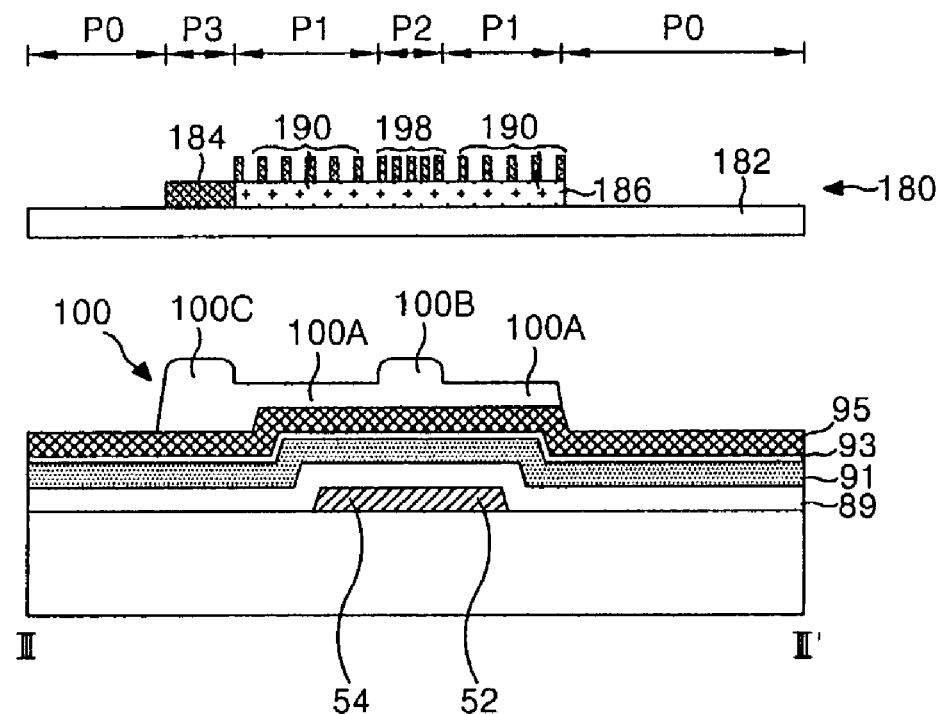
FIG. 14 is a cross sectional view of another exemplary second mask implemented during the second masking process according to the present invention.

FIG. 14 is a cross sectional view of another exemplary second mask implemented during the second masking process according to the present invention. In FIG. 14, a second mask 180 may include a first partial transmitting layer 186 formed with a first transmittance and first diffractive exposure slits 190 formed thereon for each first gap at first partial exposure areas P1 of a mask substrate 172. The first partial transmitting layer 186 formed with the first transmittance may include second diffractive exposure slits 198 formed thereon for each second gap that may be narrower than the first gap at a second partial exposure area P2, and a shielding layer 184 may be formed at a shielding area P3. In addition, the second mask 180 may include full exposure areas P0 to fully expose portions of the mask substrate 182. The transparent mask substrate 182 in the second mask 180 may include quartz (SiO2), the shielding layer 184 and the first and second diffractive exposure slits 190 and 192 may include metallic materials, such as chrome (Cr), and the partial transmitting layers 186 may include materials, such as MoSix.

During photolithographic processes using the second mask 180, any photo-resist fully exposed through the full exposure areas P0 of the second mask 180 may be removed. A photo-resist pattern 100 may be formed within an area that is not exposed or is partially exposed through the shielding area P3 and the first and second partial exposure areas P1 and P2. For example, a first part-exposed area 100A that is partially exposed by the first diffractive exposure slits 190 and the partial transmitting layer 186 of the second mask 180 may be formed with a first height in the photo-resist pattern 100. As compared with the first part-exposed area 100A, a second part-exposed area 100B of the photo-resist pattern 100 where less amount of light is irradiated by the second diffractive exposure slits 192 and the partial transmitting layer 186 of the second mask 180 may be formed with a second height larger than the first height. In addition, a shielded area 100C of the photo-resist pattern 100 that is not exposed by the shielding layer 184 of the second mask 180 may have a third height larger than the second height.

Figure 15:
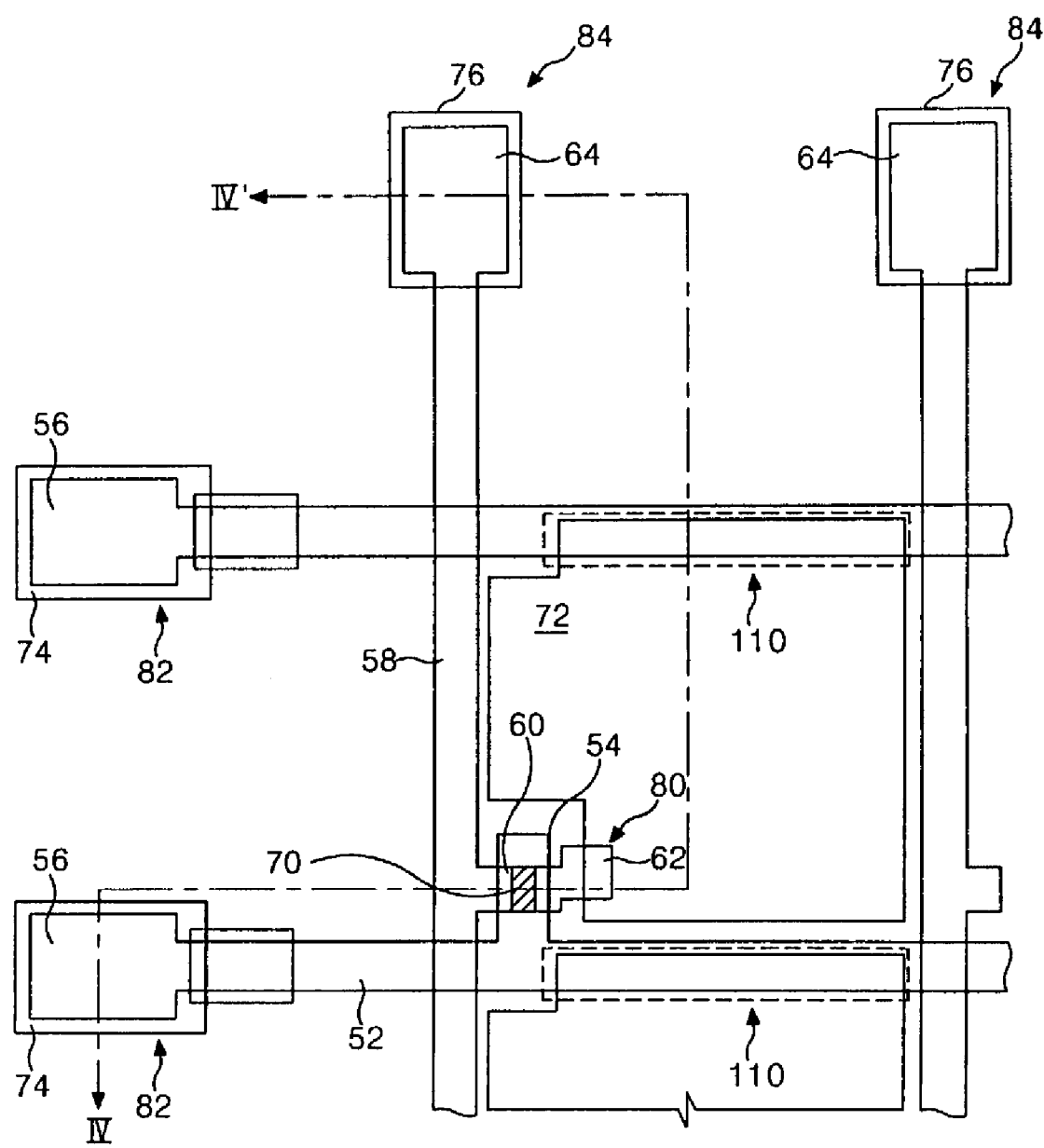
FIG. 15 is a partial plan view of another exemplary thin film transistor array substrate according to the present invention.
Figure 16:
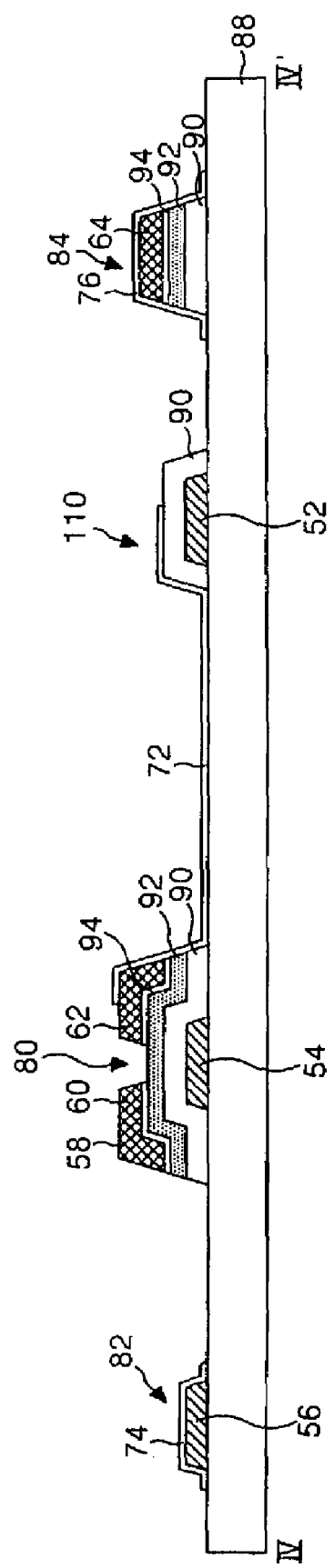
FIG. 16 is a cross sectional view of the exemplary thin film transistor array substrate of FIG. 15 along IV–IV' according to the present invention.

FIG. 15 is a partial plan view of another exemplary thin film transistor array substrate according to the present invention, and FIG. 16 is a cross sectional view of the exemplary thin film transistor array substrate of FIG. 15 along IV–IV' according to the present invention. Since the thin film transistor array substrate shown in FIGS. 15 and 16 have similar elements as those shown in FIGS. 4 and 5, except for the configuration of a storage capacitor 110, the similar elements will be given the same reference numerals and a detailed description about them will be omitted.

In FIGS. 4 and 5, the storage capacitor 78 may include the pre-stage gate line 52, the storage electrode 66, the gate insulating pattern 90, the active layer 92, and the ohmic contact layer 94, wherein the storage capacitor 78 connects to the pixel electrode 72. On the other hand, in FIGS. 15 and 16, the storage capacitor 110 may include the pre-stage gate line 52, the gate insulating pattern 90, and the pixel electrode 72. For example, in the storage capacitor 110 shown in FIGS. 15 and 16, the active layer 92, the ohmic contact layer 94, and the storage electrode 66 may be removed. Removal of the active layer 92, the ohmic contact layer 94, and the storage electrode 66 may reduce a gap between the gate line 52 and the pixel electrode 72, thereby increasing capacitance of the storage capacitor 110. Removal of the active layer 92, the ohmic contact layer 94, and the storage electrode 66 from the storage capacitor 110 may be performed using an erasure area (not shown) of semiconductor source/drain patterns caused by a second partial exposure during a second mask process corresponding to a position of the storage capacitor 110.

Figure 17A:
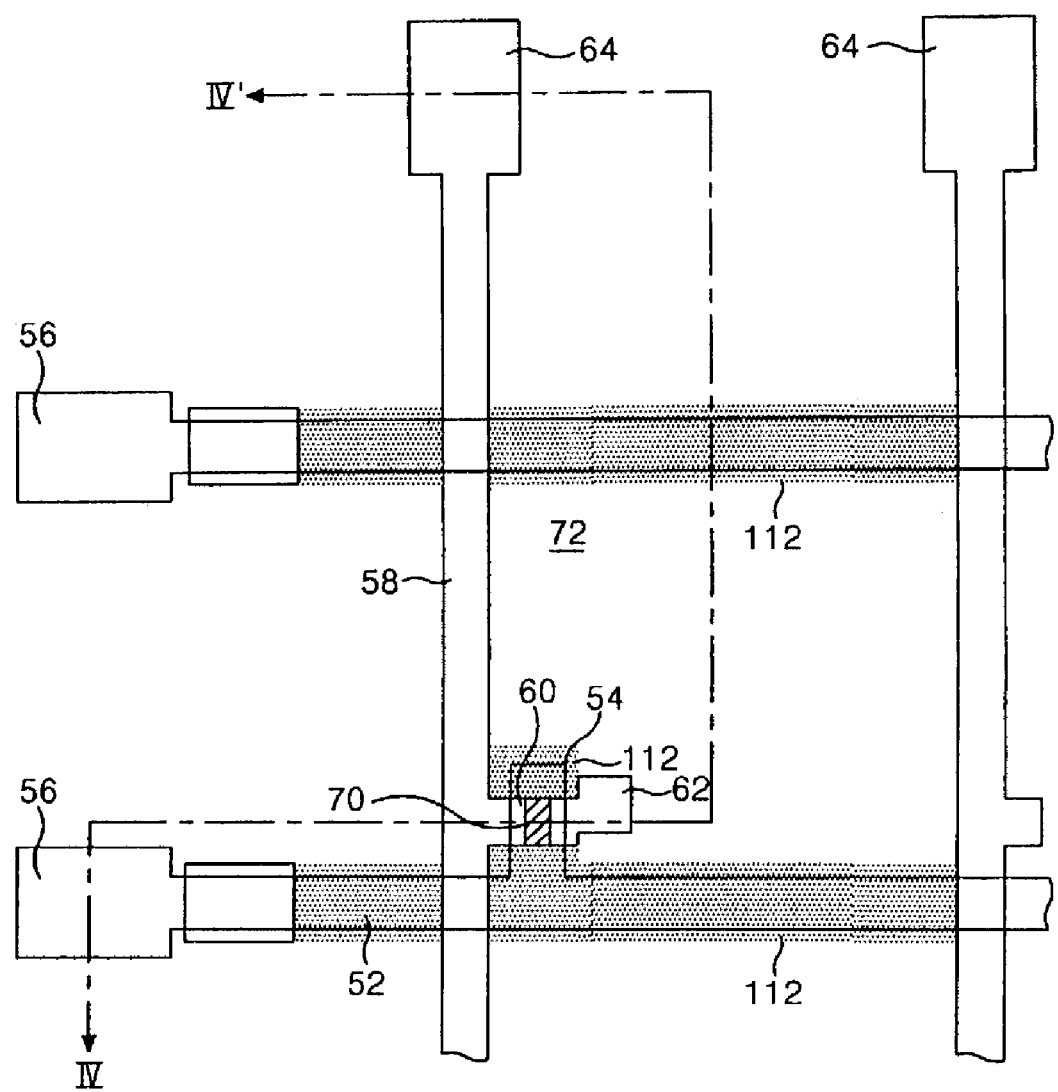
FIG. 17A is a partial plan view of another exemplary second masking process according to the present invention.
Figure 17B:
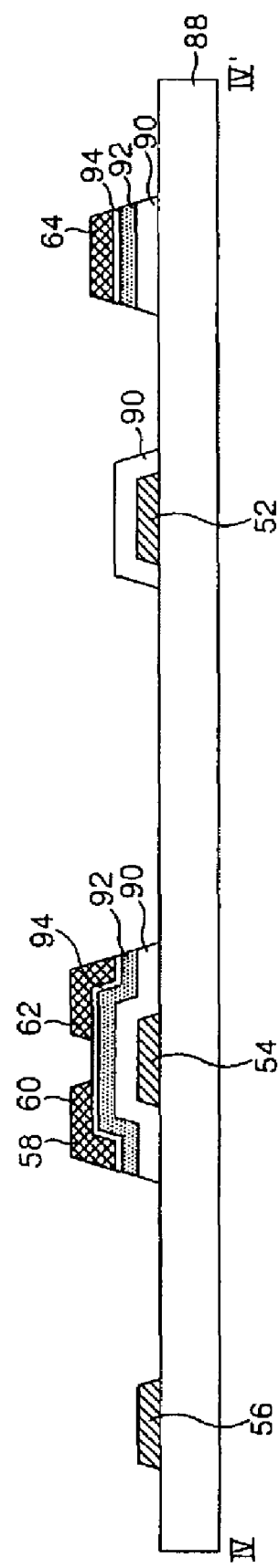
FIG. 17B is a cross sectional view of the exemplary second masking process of FIG. 17A along IV–IV' according to the present invention.

FIG. 17A is a partial plan view of another exemplary second masking process according to the present invention, and FIG. 17B is a cross sectional view of the exemplary second masking process of FIG. 17A along IV–IV' according to the present invention. In FIGS. 17A and 17B, the first mask process may be similar to the process described with regard to FIGS. 6A and 6B, and the third mask process may be similar to the process described with regard to FIGS. 8A and 8B.

In FIGS. 17A and 17B, a gate insulating pattern 90, a semiconductor pattern, and a source/drain patterns may be formed on a lower substrate 88 provided with gate patterns using the first mask process (see FIGS. 6A and 6B, for example). On the lower substrate 88 after the first mask process is completed, a gate insulating layer, an amorphous silicon layer, an n+ amorphous silicon layer, and a source/drain metal layer may be sequentially deposited using plasma enhanced chemical vapor deposition (PECVD) or sputtering, for example. The gate insulating layer may include inorganic insulating materials, such as silicon oxide SiOx or silicon nitride SiNx, and the source/drain patterns may include metallic materials, such as Cr, MoW, Cr/Al, Cu, Al(Nd), Mo/Al, Mo/Al(Nd), and Cr/Al(Nd).

Subsequently, a photo-resist pattern may be formed on the source/drain patterns during photolithographic processes using a second mask. The second mask may be a partial exposure mask including full exposure areas P0, first partial exposure areas P1, a second partial exposure area P2, and a shielding area P3, as shown in FIGS. 9A, 10A, and 11–14. Accordingly, the photo-resist pattern, as described above, may include a first partially-exposed area with a first height, a second partially-exposed area with a second height, and a shielded area with a third height.

A gate insulating pattern 90, a semiconductor pattern that includes an active layer 92 and an ohmic contact layer 94, and a source/drain pattern, all having similar patterns, may be formed by an etching process using a two-step photo-resist pattern. Subsequently, the first part-exposed areas of the photo-resist pattern may be removed during a first ashing process, and then the semiconductor and source/drain patterns corresponding to the first part-exposed areas may be selectively removed at the thin film transistor area and the gate line 52 area by an etching process to expose the gate insulating pattern 90. For example, areas 112 where the semiconductor and source/drain patterns are removed at the thin film transistor area corresponds to remaining areas except for areas where a channel (not shown) and source and drain electrodes 60 and 62 are formed. If the semiconductor pattern is exposed to light, it becomes activated to prevent light leakage current from being generated. Further, the area 112 where the semiconductor and source/drain patterns at the gate line 52 area corresponds to areas between the data lines 58 including the area where the storage capacitor is formed, i.e., the remaining gate line 52 area except for the intersection of the gate line 52 and the data line 58. Accordingly, short-circuiting and signal interference between the data lines 58 caused by the semiconductor and source/drain patterns are prevented.

Then, the second partially-exposed area of the photo-resist pattern may be removed during a second ashing process, and the source/drain pattern may be removed at a channel region 70 of the thin film transistor by an etching process subsequent thereto, thereby exposing the ohmic contact layer 94 of the semiconductor pattern. In addition, remaining shielded areas of the photo-resist may be removed by a stripping process.

Figure 18:
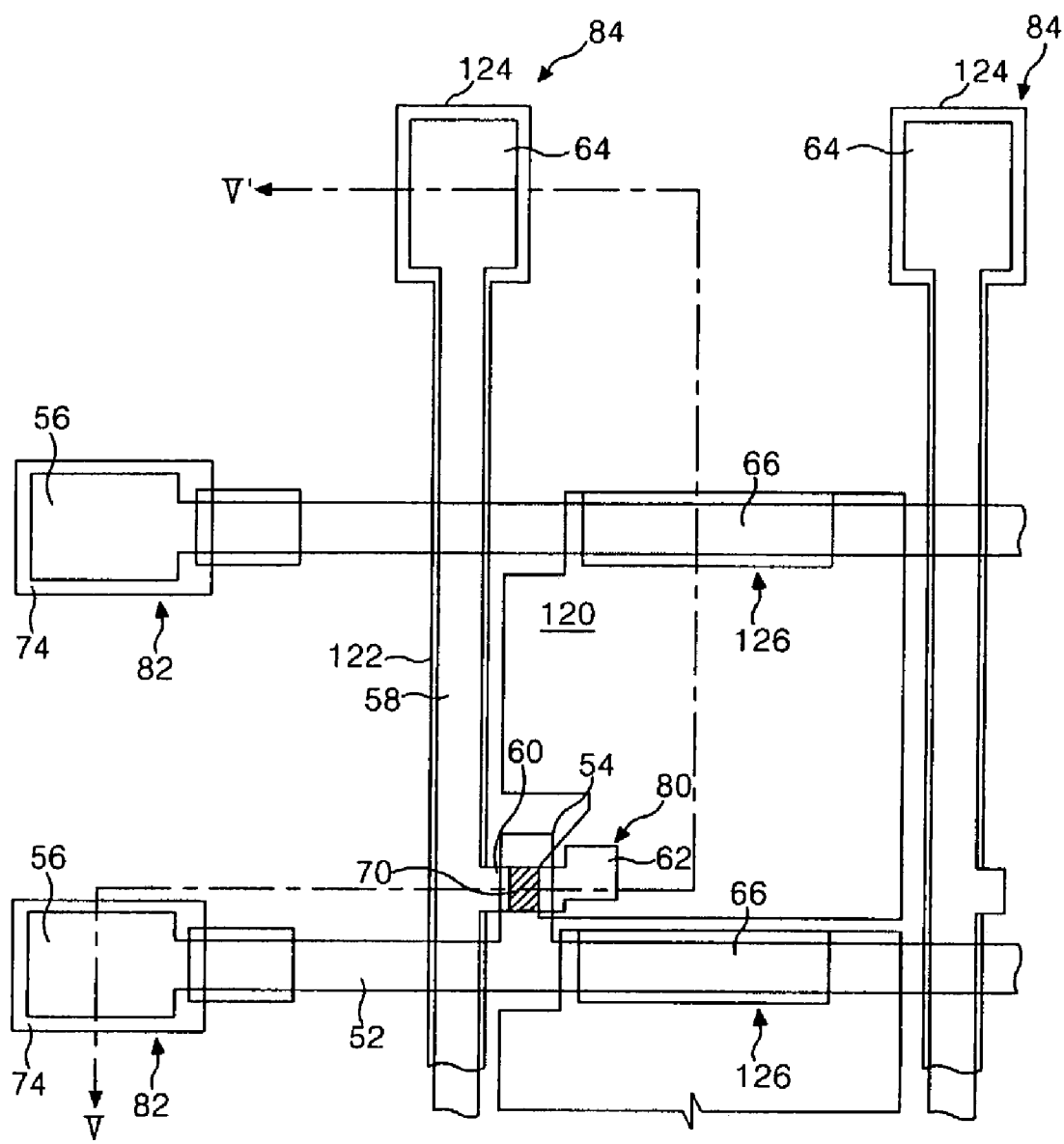
FIG. 18 is a partial plan view of another exemplary thin film transistor array substrate according to the present invention.
Figure 19:
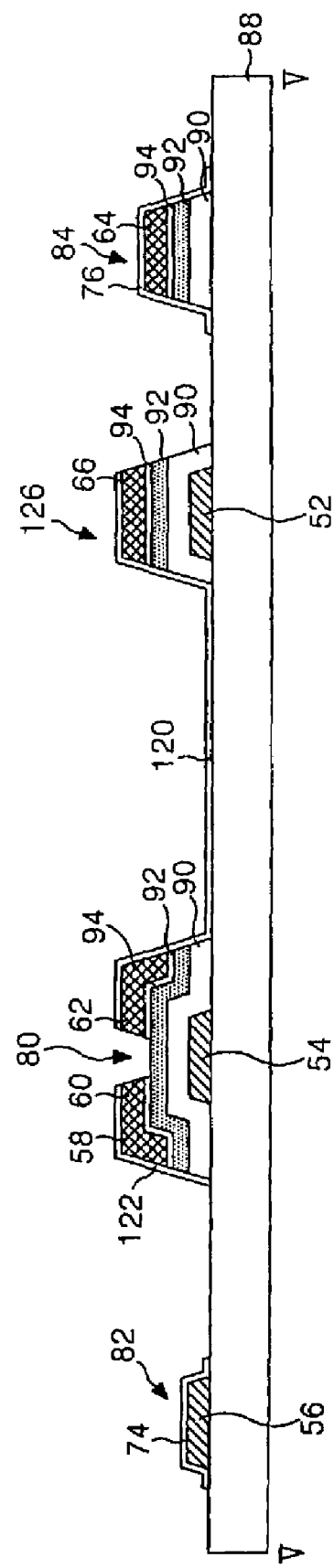
FIG. 19 is a cross sectional view of the exemplary thin film transistor array substrate of FIG. 18 along V–V' according to the present invention.

FIG. 18 is a partial plan view of another exemplary thin film transistor array substrate according to the present invention, and FIG. 19 is a cross sectional view of the exemplary thin film transistor array substrate of FIG. 18 along V–V' according to the present invention. Since the thin film transistor array substrate shown in FIGS. 18 and 19 have similar elements, except that a transparent electrode pattern is further formed along the source/drain pattern, as compared with the thin film transistor array substrate shown in FIGS. 4 and 5, the similar elements will be given the same reference numerals and a detailed description about them will be omitted.

In FIGS. 18 and 19, a transparent electrode pattern may include a pixel electrode 120, a gate pad protective electrode 82, a data pad protective electrode 124, and an upper data line 122. The upper data line 122 may be formed along a lower data line 58 to connect with the data pad protective electrode 124. The pixel electrode 120 may completely cover a drain electrode 62 and a storage electrode 66, wherein the storage electrode 66 may overlap a pre-stage gate line 52. Accordingly, a storage capacitor 126 may include the pre-stage gate line 52, a gate insulating pattern 90, an active layer 92, an ohmic contact layer 94, and the pixel electrode 120. The upper data line 122 may completely cover a source electrode 60 and the lower data line 58 and may be formed of a material of the source electrode 60 and the drain electrode 62.

Transparent electrode patterns may cover all the source/drain patterns to protect the source/drain patterns from etchants while patterning a transparent electrode material layer during a third mask process, and at the same time, may be used as a redundancy pattern to prevent the source/drain patterns from electrically short-circuiting.

Manufacturing methods of the thin film transistor array substrate with such a configuration may include the first mask process where the gate patterns are formed, as shown in FIGS. 6A and 6B, the second mask process where the gate insulating pattern 90, the semiconductor pattern, and the source/drain pattern are formed, as shown in FIGS. 7A and 7B, and the third mask process where the transparent electrode pattern is formed, as shown in FIGS. 18 and 19.

As described above, the thin film transistor array substrate and the manufacturing methods thereof according to the present invention employ the three-mask process to simplify the substrate structure and manufacturing process further, thereby reducing manufacturing costs and improving yield.

Furthermore, in the thin film transistor array substrate and the manufacturing methods thereof according to the present invention, the two-step photo-resist pattern may be utilized in use of the partial exposure mask in the second mask process. Accordingly, the gate insulating pattern and the semiconductor pattern, and the source/drain pattern may be simultaneously formed, thereby enabling the gate insulating pattern, the semiconductor pattern, and the source/drain pattern to be selectively removed. For example, the partial exposure mask has its partial exposure amount made to be different by areas in accordance with the diffractive exposure slits having their gaps different by areas, the partial transmitting layer having its transmittance different by areas depending on its material or thickness, or the combination of the diffractive exposure slits and the partial transmitting layer, thus the photo-resist pattern is made to be at least two-stepped.

Furthermore, in the thin film transistor array substrate and the manufacturing methods thereof according to the present invention, the transparent electrode pattern may be formed to cover the source/drain pattern, thereby protecting the source/drain pattern from etchants while patterning the transparent electrode layer and preventing the source/drain pattern from becoming electrically short-circuited.

It will be apparent to those skilled in the art that various modifications and variations can be made in the thin film transistor array substrate, manufacturing method thereof, and mask of the present invention without departing from the spirit or scope of the invention. Thus, it is intended that the present invention cover the modifications and variations of this invention provided they come within the scope or the appended claims and their equivalents.

What is claimed is:

1. A manufacturing method for a thin film transistor array substrate, comprising:
    using a first mask to form gate patterns having a gate electrode, a gate line connected to the gate electrode, and a gate pad connected to the gate line on a substrate;
    using a second mask to form a gate insulating pattern at an area that covers the gate electrode and gate line of the gate patterns, to form a semiconductor pattern having a same pattern as the gate insulating pattern and partially removed at the gate line, and to form a source/drain pattern having the same pattern as the semiconductor pattern and having a source electrode and a drain electrode of a thin film transistor, a data line connected to the source electrode, and a data pad connected to the data line; and
    using a third mask to form a transparent electrode pattern having a pixel electrode formed at a pixel area and connected to the drain electrode, a gate pad protective electrode formed on the gate pad, and a data pad protective electrode formed contacting upper and sidewall portions of the data pad.

2. The manufacturing method according to claim 1, wherein the semiconductor pattern includes:
    an active layer; and
    an ohmic contact layer formed on the active layer,
    wherein the step of using a third mask process further includes steps of forming a channel of the thin film transistor that includes the active layer by removing the ohmic contact layer between the source electrode and the drain electrode.

3. The manufacturing method according to claim 1, wherein the step of using a third mask includes steps of forming the pixel electrode to overlap an adjacent gate line having the gate insulating pattern therebetween for forming a storage capacitor.

4. The manufacturing method according to claim 1, wherein the step of using a second mask includes use of a full exposure area, a shielding area, and a partial exposure mask that includes a first partial exposure area having a first partial exposure amount and a second partial exposure area having a second partial exposure amount different from the first amount.

5. The manufacturing method according to claim 1, further comprising a step of:
    applying a liquid crystal alignment film on the substrate provided with the transparent electrode pattern.

6. The manufacturing method according to claim 3, wherein the step of using a second mask further includes a step of forming a semiconductor pattern and a storage electrode between the gate insulating pattern and the pixel electrode that are included in the storage capacitor.

7. The manufacturing method according to claim 6, wherein the step of using a third mask further includes a step of forming a second data line that is included in the transparent electrode pattern, covers the source electrode and the data line, and connects to the data pad protective electrode, wherein the pixel electrode is formed to cover the drain electrode and the storage electrode.

8. The manufacturing method according to claim 4, wherein the step of using a second mask further includes steps of:
    forming a gate insulating layer, a semiconductor layer, and a source/drain metal layer sequentially on the substrate provided with the gate patterns;
    forming a photo-resist pattern on the source/drain metal layer by photolithography using the partial exposure mask, the photo-resist pattern has first area having a first height, a second area having a second height, and a third area having a third height, the first, second, and third heights each being different from one another;
    patterning the source/drain metal layer, the semiconductor layer, and the gate insulating layer using the photo-resist pattern as a mask to form the gate insulating pattern, the semiconductor pattern, and the source/drain pattern;
    removing a first portion of the photo-resist pattern by a designated depth to remove the photo-resist pattern within the first area, and removing the source/drain pattern and the semiconductor pattern corresponding to the first area at the thin film transistor area and the gate line area to expose the gate insulating pattern, by a first ashing process;
    removing a second portion of the photo-resist pattern by a designated depth to remove the photo-resist pattern within the second area, and removing the source/drain pattern corresponding to the second area at a channel region of the thin film transistor by a second ashing process; and
    removing a third portion of the photo-resist pattern within the third area of the photo-resist pattern by a stripping process.

9. The manufacturing method according to claim 8, wherein the first and second areas within the photo-resist pattern correspond to the first and second partial exposure areas of the partial exposure mask, respectively, and the third area corresponds to one of the full exposure area and the shielding area.

10. The manufacturing method according to claim 8, wherein the area where the source/drain pattern and the semiconductor pattern are removed is a remaining area except for an area where the gate line overlaps the data line and the storage electrode in an area of the gate line and the remaining area except for an area where the channel region and the source and drain electrodes are formed in the thin film transistor area.

* * * * *